US010262948B2

(12) United States Patent
Nonaka

(10) Patent No.: US 10,262,948 B2
(45) Date of Patent: Apr. 16, 2019

(54) SEMICONDUCTOR MODULE HAVING OUTFLOW PREVENTION EXTERNAL TERMINALS

(71) Applicant: FUJI ELECTRIC CO., LTD., Kawasaki-shi, Kanagawa (JP)

(72) Inventor: Tomomi Nonaka, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/398,466

(22) Filed: Jan. 4, 2017

(65) Prior Publication Data
US 2017/0236782 A1 Aug. 17, 2017

(30) Foreign Application Priority Data
Feb. 16, 2016 (JP) .................. 2016-026915

(51) Int. Cl.
H01L 25/16 (2006.01)
H01L 23/498 (2006.01)
H01L 23/538 (2006.01)
H01L 21/56 (2006.01)

(52) U.S. Cl.
CPC ........ H01L 23/5385 (2013.01); H01L 21/565 (2013.01); H01L 23/49811 (2013.01); H01L 23/49827 (2013.01); H01L 23/49833 (2013.01); H01L 23/5384 (2013.01); H01L 25/162 (2013.01)

(58) Field of Classification Search
CPC . H01L 25/162; H01L 24/72; H01L 23/49811; H01L 23/49827; H01L 21/565; H01L 21/566
See application file for complete search history.

(56) References Cited

U.S. PATENT DOCUMENTS

2014/0367736 A1* 12/2014 Iizuka ................... H01L 25/072
257/133

FOREIGN PATENT DOCUMENTS

| JP | S62-22468 A | 1/1987 |
| JP | H01-280518 A | 11/1989 |
| JP | H05-74999 A | 3/1993 |
| JP | H05-329849 A | 12/1993 |
| JP | H06-216293 A | 8/1994 |
| JP | 2014-090016 A | 5/2014 |

* cited by examiner

Primary Examiner — Phat X Cao
(74) Attorney, Agent, or Firm — Rabin & Berdo, P.C.

(57) ABSTRACT

A semiconductor module manufacturing method, including preparing an external terminal that is of a pin shape and that has an outflow prevention portion formed on an outer surface portion thereof, attaching the external terminal to a substrate and electrically connecting the external terminal to the substrate, preparing a transfer molding die including a first mold portion and a second mold portion, which are combinable by attaching a parting surface of the first mold portion to a parting surface of the second mold portion, to thereby form a first cavity and a second cavity that are in communication with each other, combining the first and second mold portions to accommodate the substrate and the external terminal respectively in the first and second cavities, and to sandwich the outflow prevention portion between the first and second mold portions, and encapsulating the substrate by injecting resin into the first cavity.

15 Claims, 19 Drawing Sheets

SEMICONDUCTOR MODULE HAVING OUTFLOW PREVENTION EXTERNAL TERMINALS

CROSS-REFERENCE TO RELATED APPLICATION

This application is based upon and claims the benefit of priority of the prior Japanese Patent Application No. 2016-026915, filed on Feb. 16, 2016, the entire contents of which are incorporated herein by reference.

BACKGROUND OF THE INVENTION

1. Field of the Invention

The embodiments discussed herein relate a semiconductor module manufacturing method and a semiconductor module.

2. Background of the Related Art

A semiconductor module includes semiconductor elements mounted on a die pad portion and a lead portion electrically connected to the semiconductor elements via wirings, and these components are encapsulated with encapsulation resin. When such a semiconductor module is manufactured, the die pad portion and the semiconductor elements are inserted into a cavity in a transfer molding die formed by upper and lower dies, and resin is injected into the cavity where the lead portion is sandwiched between the upper and lower dies. In this manufacturing process, if there is space between the lead portion and the pair of the upper and lower dies, the resin flows into the space, and a burr is formed on the lead portion. To prevent the formation of such a burr, a method has been proposed. According to this method, a protruded portion is arranged at an end portion of a lead portion, and inflow of resin is prevented thereby (see, for example, Japanese Laid-open Patent Publication No. 06-216293).

There is a semiconductor module that includes a plurality of power semiconductor elements and that is used as a power conversion device or a switching device. For example, there is a semiconductor module that is allowed to function as a switching device by connecting semiconductor chips including an insulated gate bipolar transistor (IGBT), a metal-oxide semiconductor field-effect transistor (MOSFET), etc. in parallel to each other (see, for example, Japanese Laid-open Patent Publication No. 2014-90016).

Such a semiconductor module is also manufactured by inserting an insulating substrate, semiconductor elements, a printed substrate, and an external terminal into a cavity in a transfer molding die and injecting resin into the cavity.

However, as is the case with Japanese Laid-open Patent Publication No. 06-216293, the semiconductor module discussed in Japanese Laid-open Patent Publication No. 2014-90016 also has the same problem. Namely, the resin flows into the space between the transfer molding die and a pin-shaped external terminal, and a burr is formed on the external terminal. If a burr is formed, the chance that the electrical continuity of the pin-shaped external terminal is deteriorated is increased. If the electrical continuity is deteriorated, since an adequate function or adequate performance of the semiconductor module is not obtained, there is a possibility that characteristics of the semiconductor module are deteriorated.

SUMMARY OF THE INVENTION

In one aspect of the embodiments, there is provided a semiconductor module manufacturing method including: preparing a pin-shaped external terminal; attaching the external terminal to a substrate and electrically connecting the external terminal to the substrate; preparing a transfer molding die including a first mold portion and a second mold portion, combining the first and second mold portions to form a first cavity that accommodates the substrate and a second cavity that is in communication with the first cavity and that accommodates the external terminal, and sandwiching an outflow prevention portion arranged on an outer surface portion of the external terminal by bringing together a parting surface of the first mold portion and a parting surface of the second mold portion; and encapsulating the substrate by injecting resin into the first cavity.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
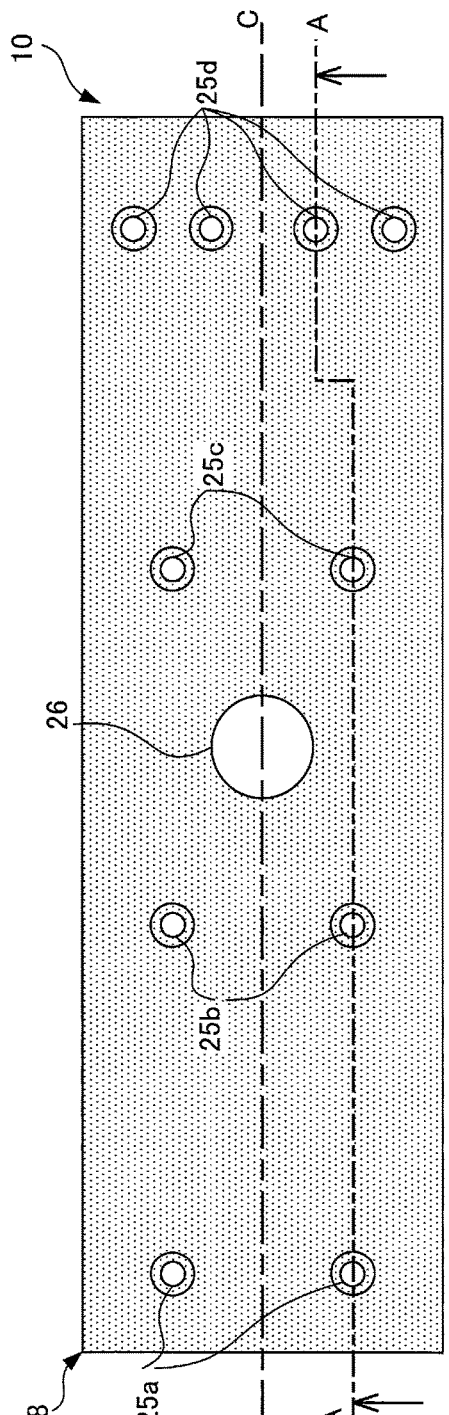
FIGS. 1A and 1B illustrate a semiconductor module according to a first embodiment.

Several embodiments will be described below with reference to the accompanying drawings, wherein like reference characters refer to like elements throughout.

[First Embodiment]

A semiconductor module 10 according to a first embodiment will be described with reference to FIGS. 1A and 1B and FIG. 2.

Figure 1B:
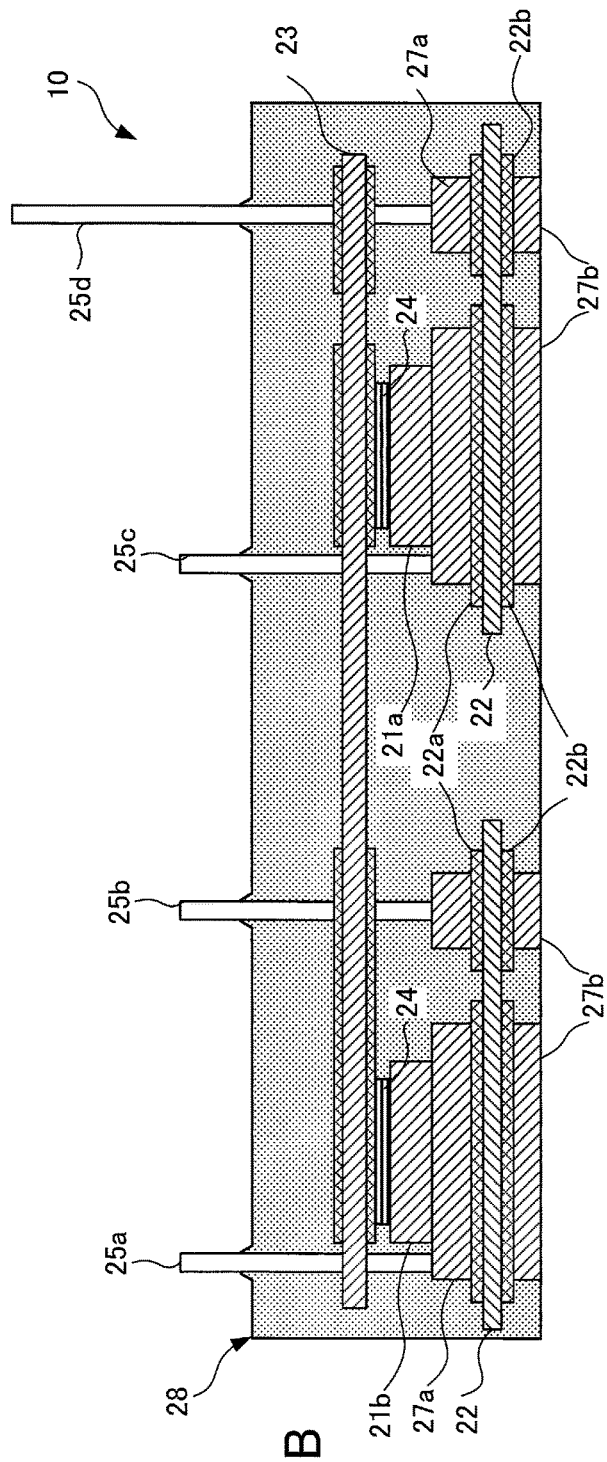

FIGS. 1A and 1B illustrate the semiconductor module 10 according to the first embodiment.

FIG. 1A is a top view of the semiconductor module 10, and FIG. 1B is a sectional view of the semiconductor module 10, taken along an alternate long and short dash line A-A in FIG. 1A.

Figure 2:
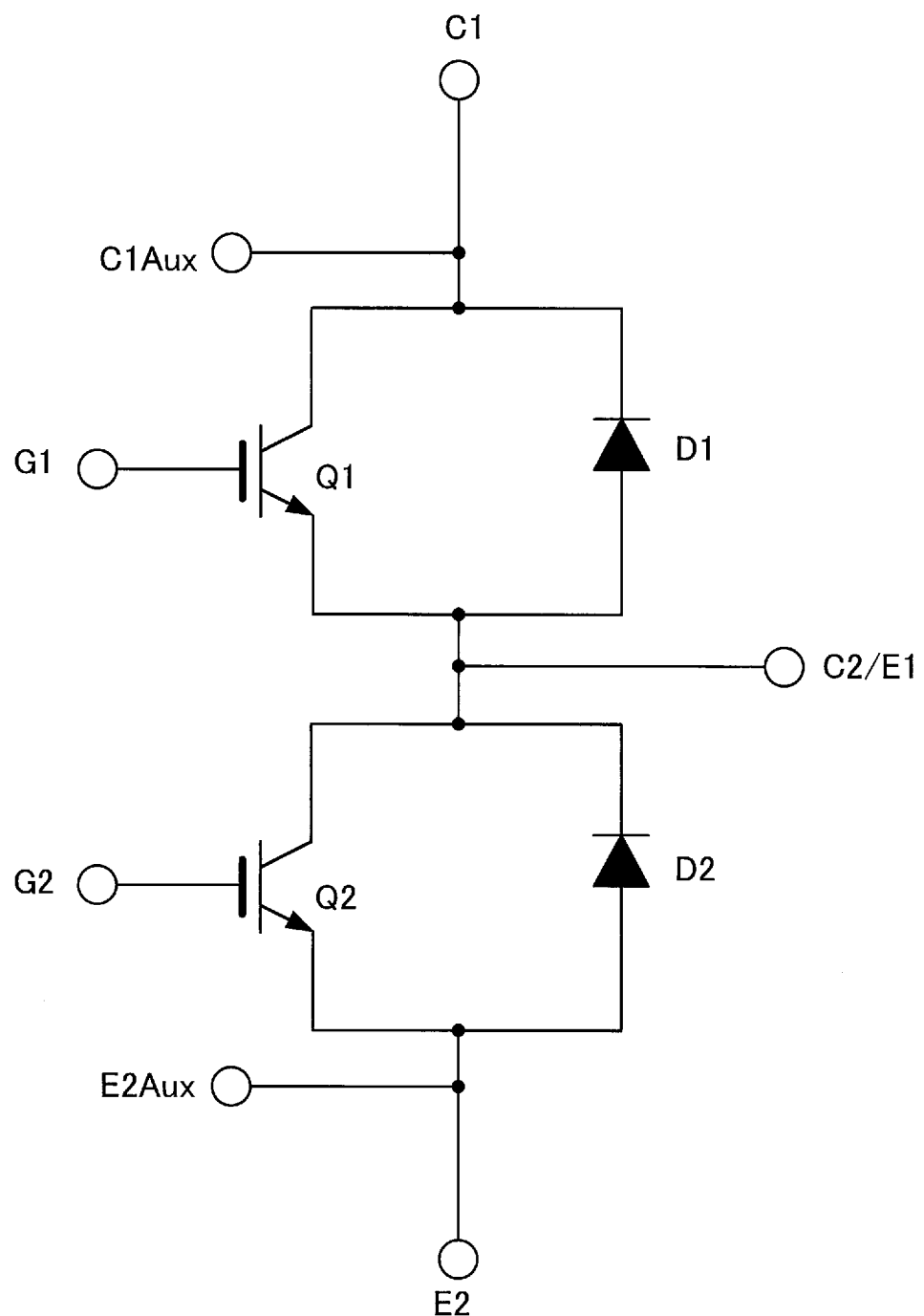
FIG. 2 is an equivalent circuit illustrating a circuit configuration of the semiconductor module according to the first embodiment.

FIG. 2 is an equivalent circuit illustrating a circuit configuration of the semiconductor module 10 according to the first embodiment.

The semiconductor module 10 includes two sets of semiconductor circuits and a wiring substrate 23 forming a common wiring circuit above the semiconductor circuits. One of the two sets of semiconductor circuits is configured by mounting a semiconductor chip 21a on an insulating substrate 22, and the other set of semiconductor circuits is configured by mounting a semiconductor chip 21b on another insulating substrate 22. The semiconductor chips 21a and 21b in these semiconductor circuits are configured by power devices such as power MOSFETs or IGBTs and free wheeling diodes (FWDs). For simplicity, in FIG. 1B, only a single semiconductor chip 21a (21b) is illustrated on a single insulating substrate 22. A switching device such as an IGBT and an FWD may be arranged on a conductor layer on the front surface of a single insulating substrate 22, and the elements may be connected as illustrated by the equivalent circuit in FIG. 2. A switching device such as a power MOSFET and a diode may be combined as the semiconductor chip 21a (21b). Alternatively, either a switching device or a diode may be used as the semiconductor chip 21a (21b). A reverse conducting (RC)-IGBT in which an IGBT and a diode are unified may be used. A plurality of power devices of the same kind may be arranged on a single insulating substrate 22, and these power devices may electrically be connected in parallel to each other.

Various kinds of power devices as described may be used for these semiconductor chips 21a and 21b. In addition, for example, the semiconductor chips 21a and 21b may be formed on a silicon substrate or a silicon carbide substrate.

An individual insulating substrate 22 is made of ceramics with good heat conductivity such as alumina. Copper foils 22a and 22b are attached on the front and back surfaces of an individual insulating substrate 22, respectively. A copper plate 27a is arranged on an individual copper foil 22a. An individual copper foil 22a and an individual copper plate 27a form a conductor layer. A predetermined circuit pattern for connecting a plurality of power devices is formed on an individual conductor layer.

As illustrated by the equivalent circuit in FIG. 2, an inverse parallel circuit formed by a switching device (which will simply be referred to as a transistor) Q1 and an FWD (which will simply be referred to as a diode) D1 and an inverse parallel circuit formed by a transistor Q2 and a diode D2 may be connected in series with each other between the conductor layers on the insulating substrates 22 and the wiring substrate 23.

Semiconductor chips (power devices) arranged on a single insulating substrate 22 may be configured by forming a circuit equivalent to an inverse parallel circuit formed by a transistor and a diode illustrated in FIG. 2. Therefore, one or both of the transistor and the diode may be formed of a plurality of semiconductor chips having the same rating.

In FIG. 1B, the semiconductor chip 21a including the transistor Q1 and a semiconductor chip (not illustrated) including the diode D1 are arranged on the near and far sides on the copper plate 27a above one insulating substrate 22. Likewise, the semiconductor chip 21b including the transistor Q2 and a semiconductor chip including the diode D2 are arranged on the near and far sides on the copper plate 27a above the other insulating substrate 22. Namely, the set of the transistor Q1 and the diode D1 and the set of the transistor Q2 and the diode D2 are connected in an inverse parallel manner between the conductor layers on the insulating substrates 22 and the wiring substrate 23. These two pairs of inverse parallel circuits formed by the pair of transistors Q1 and Q2 and the pair of diodes D1 and D2 are connected in series with the wiring substrate 23 arranged thereabove via respective post-shaped electrode members 24.

While the two semiconductor chips 21a are arranged on the near and far sides on the copper plate 27a above one insulating substrate 22 in FIG. 1B, these semiconductor chips 21a may be arranged on the right and left sides on the copper plate 27a. Likewise, the semiconductor chips 21b may be arranged on the right and left sides on the corresponding copper plate 27a.

In FIG. 1B, the transistor Q1 has a collector electrode that is formed on the bottom surface of one of the semiconductor chips 21a and that is electrically connected to pin-shaped external terminals 25c forming external input terminals (collector terminals C1) of the semiconductor module 10 via the corresponding conductor layer. The transistor Q2 also has a collector electrode that is formed on the back surface of one of the semiconductor chips 21b and that is electrically connected to pin-shaped external terminals 25a forming external output terminals (collector-emitter terminals C2/E1) via the corresponding conductor layer. In addition, the transistors Q1 and Q2 have emitter and gate electrodes that are opposite to their respective collector electrodes. These emitter and gate electrodes are formed on the front surfaces of the respective semiconductor chips 21a and 21b and are electrically connected to the wiring substrate 23 via the respective electrode members 24. The emitter electrode of the transistor Q1 is electrically connected to external terminals 25a via the wiring substrate 23 and the corresponding copper plate 27a. The emitter electrode of the transistor Q2 is electrically connected to pin-shaped external terminals 25b forming external input terminals (emitter terminals E2) via the wiring substrate 23.

These external terminals 25a to 25c are formed in pairs at symmetrical positions as illustrated in FIG. 1A. The semiconductor module 10 also includes four pin-shaped external terminals 25d, in addition to the external terminals 25a to 25c. Two of the pin-shaped external terminals 25d are connected to the wiring substrate 23, forming gate terminals G1 and G2 for supplying a gate control signal to gate electrodes of the transistors Q1 and Q2 forming a half-bridge circuit. The other two pin-shaped external terminals 25d are control (auxiliary) terminals, forming, for example, inspection terminals C1Aux and E2Aux for outputting a sense signal sensing a current flowing between the collector and the emitter of the transistors Q1 and Q2. The external terminals 25d may have the same height as the external terminals 25a to 25c. Alternatively, as illustrated in FIG. 1A, the external terminals 25d may protrude more than the external terminal 25a to 25c.

Elements of the semiconductor module 10 are encapsulated and protected by encapsulation resin 28 made of epoxy resin material such as thermoset resin, for example. As a result, as illustrated in FIGS. 1A and 1B, the outer shape of the semiconductor module 10 is roughly a rectangular box. Namely, the semiconductor module 10 has a rectangular shape in a planar view. The semiconductor module 10 has a top surface, a bottom surface opposite to the top surface, and side surfaces connecting the top and bottom surfaces. One of the sides of the top surface is longer than other sides. A cylindrical penetration hole 26 having a predetermined diameter may be arranged in the middle portion of the semiconductor module 10. An end of each of the ten pin-shaped external terminals 25a to 25d protrudes from the top surface of the semiconductor module (as needed, any one of the external terminals 25a to 25d will collectively be referred to as an external terminal 25). The other end of each of the external terminals 25a to 25d is attached to a corresponding copper plate 27a. These ends may be attached by using solder, brazing filler metal, or sintered material. The two external terminals 25a are arranged symmetrically with respect to a center line C extending in a longitudinal direction of the top surface of the semiconductor module 10. Likewise, two external terminals 25b are arranged symmetrically with respect to the center line C. Likewise, the two external terminals 25c are arranged symmetrically with respect to the center line C. Each of the external terminals 25a may be equally separated from the center line C as illustrated in FIG. 1A or differently separated from the center line C. The same applies to the external terminals 25b and 25c. In FIG. 1, one external terminal 25a is arranged on a near-side line that is parallel to the center line C, and the other external terminal 25a is arranged on a far-side line that is parallel to the center line C. The same applies to the external terminals 25b and 25c. The external terminals 25a are electrically connected to the collector electrode of the semiconductor chip 21b, and the external terminals 25b neighboring the external terminals 25a are electrically connected to the emitter electrode of the semiconductor chip 21b. The external terminals 25a and 25b may be electrically connected to the cathode electrode and the anode electrode opposite thereto of the semiconductor chip (diode D1) connected to the semiconductor chip 21b in an inverse parallel manner.

A plurality of copper plates 27b are arranged in one plane on the bottom surface of the semiconductor module 10. The copper plates 27b are arranged under the respective copper foils 22b, which are arranged under the bottom surfaces of the respective insulating substrates 22. When a heat radiation fin is fastened at the bottom surface of the semiconductor module 10 by inserting a bolt or the like into the penetration hole 26 from the front surface of the semiconductor module 10, these copper plates 27a and 27b are firmly attached to the heat radiation fin to form a heat radiation surface of the semiconductor module 10.

In the above example, the collector-emitter terminals C2/E1, the emitter terminals E2, and the collector terminals C1 are associated with the pin-shaped external terminals 25a to 25c, respectively. However, other variations may be possible. The collector terminals C1, the collector-emitter terminals C2/E1, and the emitter terminals E2 may freely be associated with the pin-shaped external terminals 25a to 25c on the basis of the wirings of the copper foils 22a and 22b on the insulating substrates 22 and the wiring substrate 23.

Next, an external terminal 25 of the semiconductor module 10 will be described with reference to FIGS. 3A and 3B.

Figure 3A:
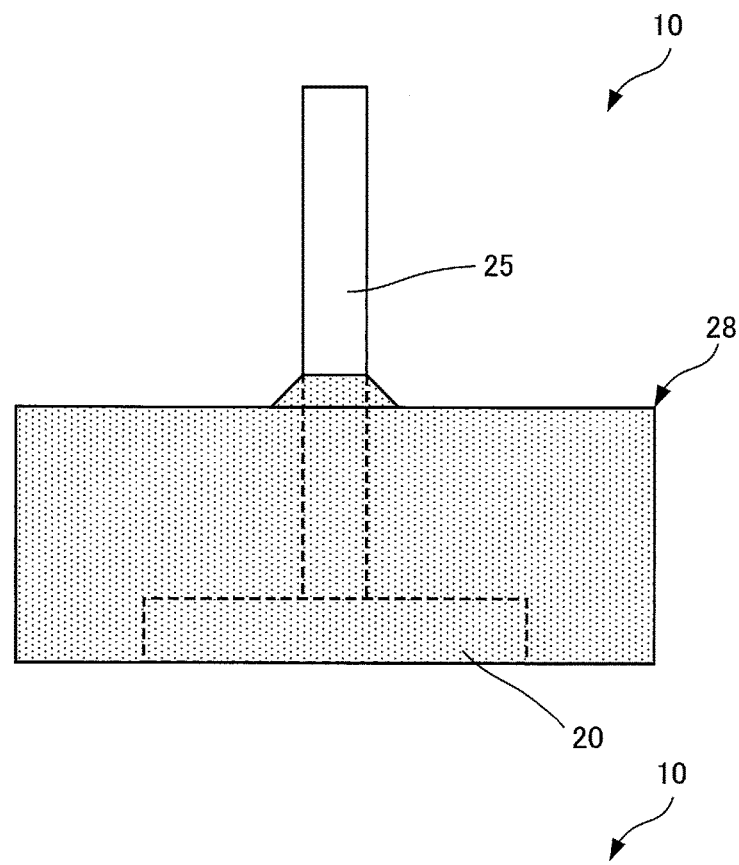
FIGS. 3A and 3B illustrate an example of the semiconductor module according to the first embodiment.
Figure 3B:
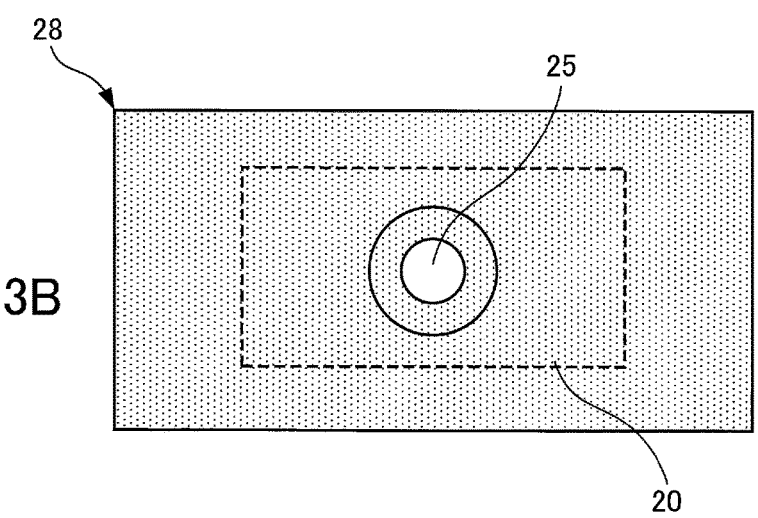

FIGS. 3A and 3B illustrate an example of the semiconductor module 10 according to the first embodiment.

FIG. 3A is a side view of the semiconductor module 10, and FIG. 3B is a top view of the semiconductor module 10. Encapsulation of an external terminal 25 with resin will be described with reference to FIGS. 3A and 3B. In FIGS. 3A and 3B, as an example of the semiconductor module 10, a substrate 20 including the insulating substrates 22, the wiring substrate 23, etc. and an external terminal 25 attached to the substrate 20 are encapsulated.

In the semiconductor module 10, as illustrated in FIGS. 3A and 3B, the external terminal 25 is vertically attached to the substrate 20. The substrate 20 and a lower portion of the external terminal 25 are encapsulated with the encapsulation resin 28, and an upper portion of the external terminal 25 is protruded from the encapsulation resin 28.

For example, the external terminal 25 is made of copper and plated with tin, nickel, or the like.

Next, a transfer molding die used for encapsulating the substrate 20 and the external terminal 25 with the encapsulation resin 28 will be described with reference to FIG. 4 and FIGS. 5A and 5B.

Figure 4:
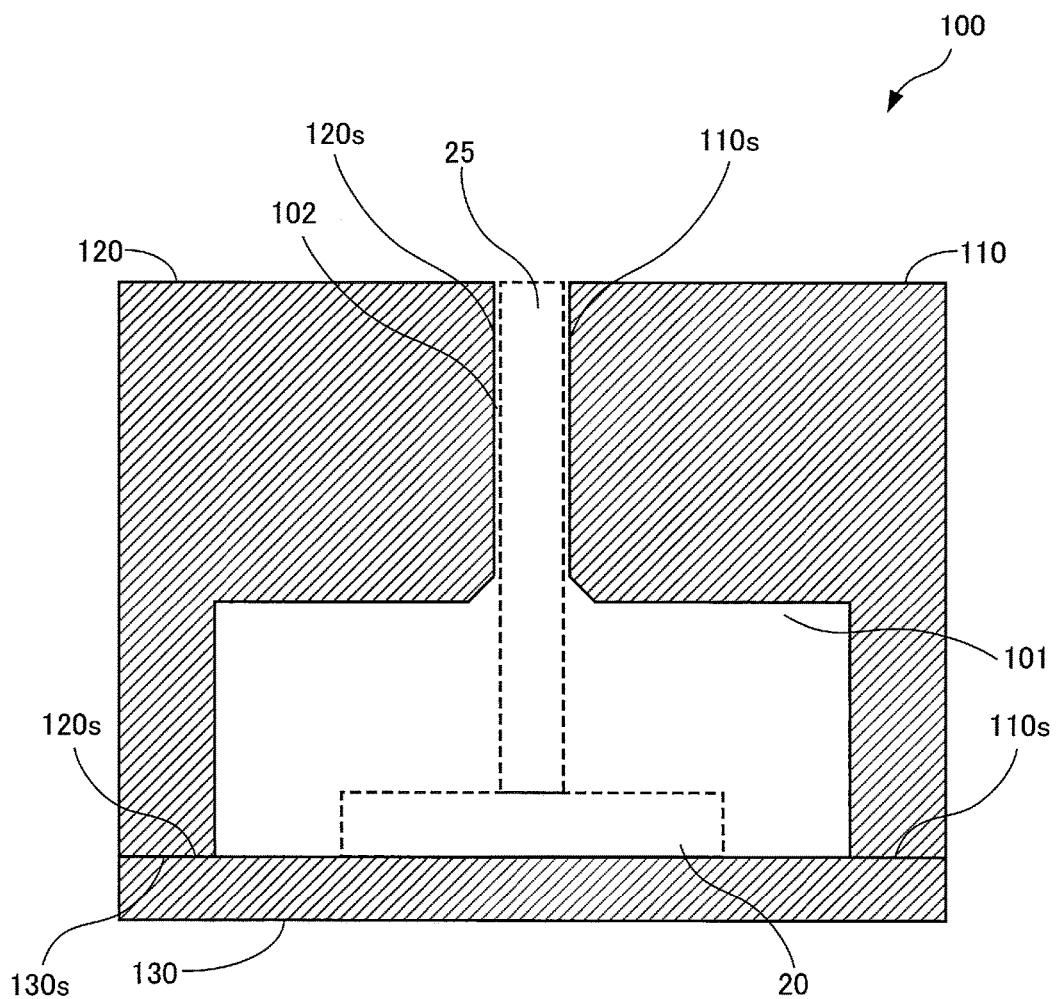
FIG. 4 is a sectional side view of a transfer molding die used for manufacturing the semiconductor module according to the first embodiment.

FIG. 4 is a sectional side view of a transfer molding die 100 used for manufacturing the semiconductor module 10 according to the first embodiment.

Figure 5A:
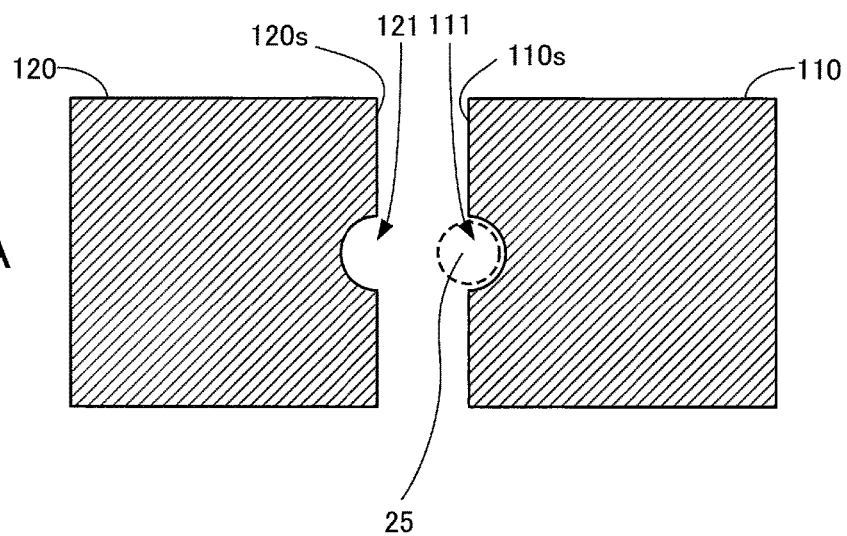
FIGS. 5A and 5B are top views of the transfer molding die used for manufacturing the semiconductor module according to the first embodiment.
Figure 5B:
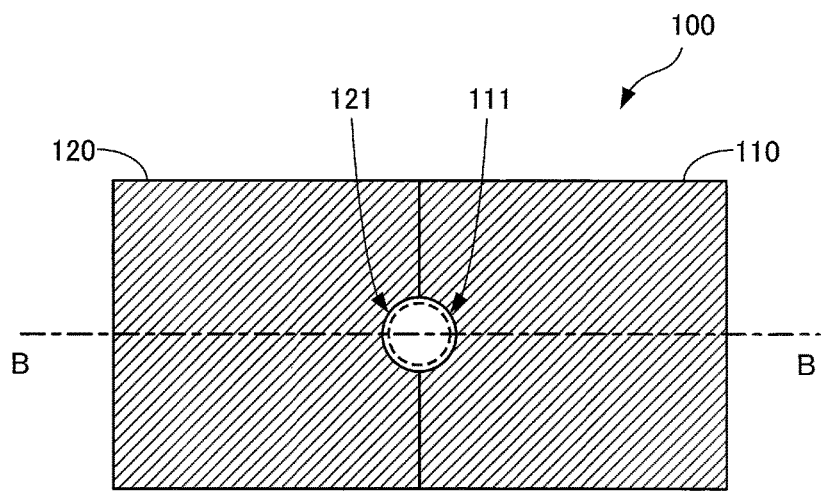

FIG. 4 is a sectional view of the transfer molding die 100, taken along an alternate long and short dash line B-B in FIG. 5B.

FIGS. 5A and 5B are top views of the transfer molding die 100 used for manufacturing the semiconductor module 10 according to the first embodiment.

FIG. 5A illustrates a movable lower die and a fixed lower die separated from each other, and FIG. 5B illustrates the movable lower die and the fixed lower die combined with each other.

More specifically, the transfer molding die 100 is formed by a fixed lower die 110, a movable lower die 120, and an upper die 130. The substrate 20 and the lower portion of the external terminal 25 attached to the substrate 20 are accommodated in a first cavity 101 formed by the fixed lower die 110, the movable lower die 120, and the upper die 130. The upper portion of the external terminal 25 is accommodated in a second cavity 102 that is formed by the fixed lower die 110 and the movable lower die 120 and that is in communication with the first cavity 101. The fixed lower die 110 has parting surfaces 110s, one of which is firmly attached to the movable lower die 120 and the other one of which is firmly attached to the upper die 130. The movable lower die 120 has parting surfaces 120s, one of which is firmly attached to the upper die 130 and the other one of which is firmly attached to the fixed lower die 110. The upper die 130 has a parting surface 130s firmly attached to the fixed lower die 110 and the movable lower die 120. One of the parting surfaces 110s has a recess 111, and one of the parting surfaces 120s has a recess 121. The second cavity 102 is formed by combining the fixed lower die 110 and the movable lower die 120 in such a manner that the recesses 111 and 121 face each other and the corresponding parting surfaces 110s and 120s are firmly attached to each other.

When this transfer molding die 100 is used, first, the substrate 20 to which the external terminal 25 is attached is placed on the upper die 130.

Next, the external terminal 25 is placed at a predetermined position of the fixed lower die 110, along with the upper die 130. The external terminal 25 is fitted in the recess 111 of the fixed lower die 110, as illustrated in FIG. 5A.

Next, from the opposite side of the fixed lower die 110, the movable lower die 120 is moved and placed to come into contact with the external terminal 25. The external terminal 25, which has been fitted in the recess 111 of the fixed lower die 110, is fitted in the recess 121 of the movable lower die 120, as illustrated in FIG. 5B.

Finally, the upper die 130 is pressed against the fixed lower die 110 and the movable lower die 120, to seal the first cavity 101.

In this way, the substrate 20 and the external terminal 25 attached to the substrate 20 are placed in the transfer molding die 100.

Next, encapsulation of the semiconductor module 10 illustrated in FIGS. 3A and 3B with resin by using the transfer molding die 100 will be described with reference to FIG. 6.

Figure 6:
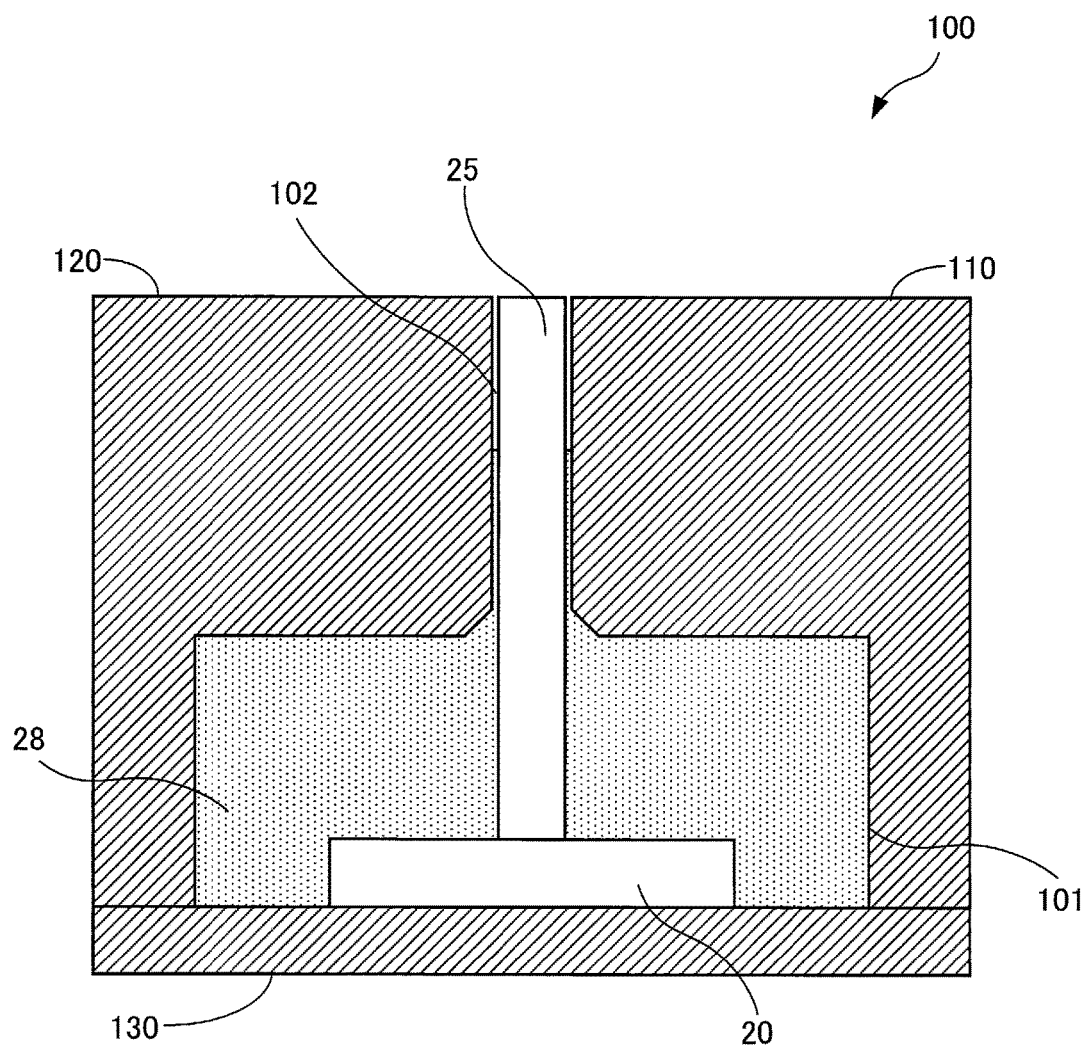
FIG. 6 illustrates a process for encapsulating a semiconductor module according to a comparative example with resin.

FIG. 6 illustrates a process for encapsulating a semiconductor module according to a comparative example with resin.

Figure 7:
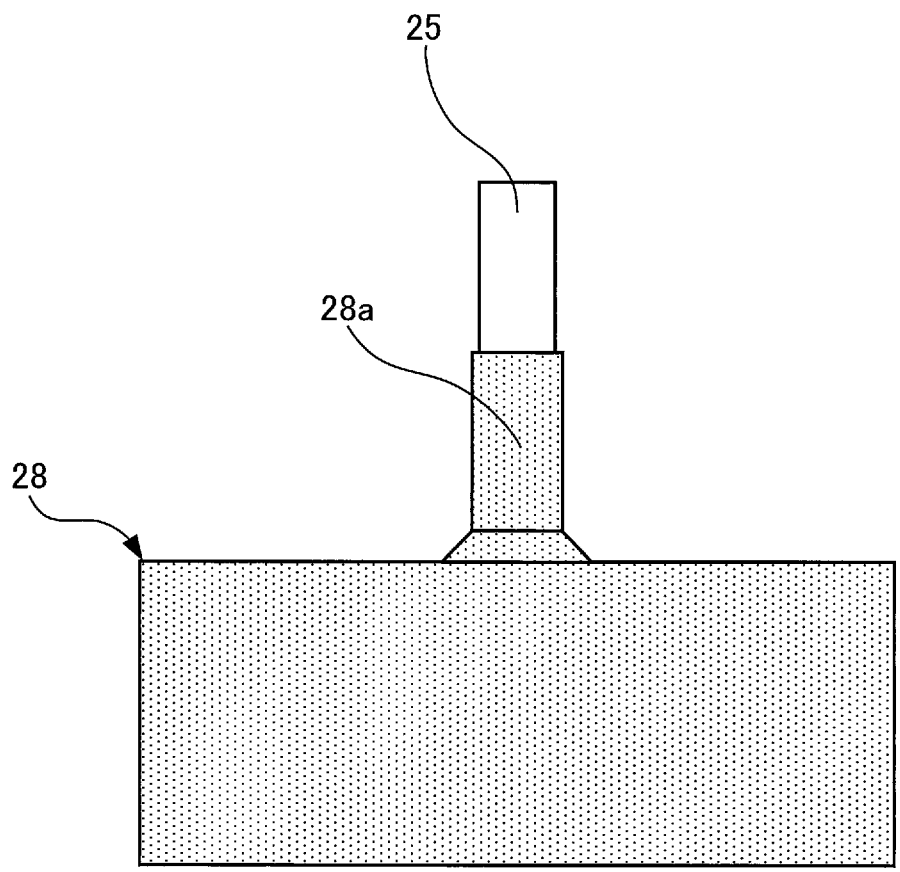
FIG. 7 is a side view of the semiconductor module according to the comparative example.

FIG. 7 is a side view of the semiconductor module according to the comparative example.

As illustrated in FIG. 4, after the substrate 20 and the external terminal 25 are placed in the transfer molding die 100, resin is injected through a gate (not illustrated) of the transfer molding die 100 to fill the first cavity 101 with the resin.

However, since the external terminal 25 is not completely attached to the second cavity 102 in the transfer molding die 100, minute space is present between the second cavity 102 and the external terminal 25. Thus, the resin injected into the first cavity 101 flows into this space. Namely, the resin flows into the space between an outer surface portion of the external terminal 25 and the second cavity 102.

After the resin is hardened, when the semiconductor module 10 is extracted from the transfer molding die 100, it is seen that the substrate 20 and the lower portion of the external terminal 25 have been encapsulated with the encapsulation resin 28 as illustrated in FIG. 7 and that a burr 28a has been formed on the outer surface portion of the external terminal 25 by the resin.

If such a burr 28a is formed on the external terminal 25, the electrical continuity of the external terminal 25 could be deteriorated. If the electrical continuity is deteriorated, since an adequate function or adequate performance of the semiconductor module 10 is not obtained, there is a possibility that characteristics of the semiconductor module 10 are deteriorated. In addition, removing the burr 28a from the external terminal 25 needs physical polishing such as brushing or blasting. Such polishing needs time and effort, and cleaning needs to be performed after polishing. Thus, since more man-hours are needed for the complex processing for removing the burr 28a, the cost is increased.

Next, a pin-shaped external terminal 25 according to the first embodiment will be described with reference to FIGS. 8 to 10.

Figure 8:
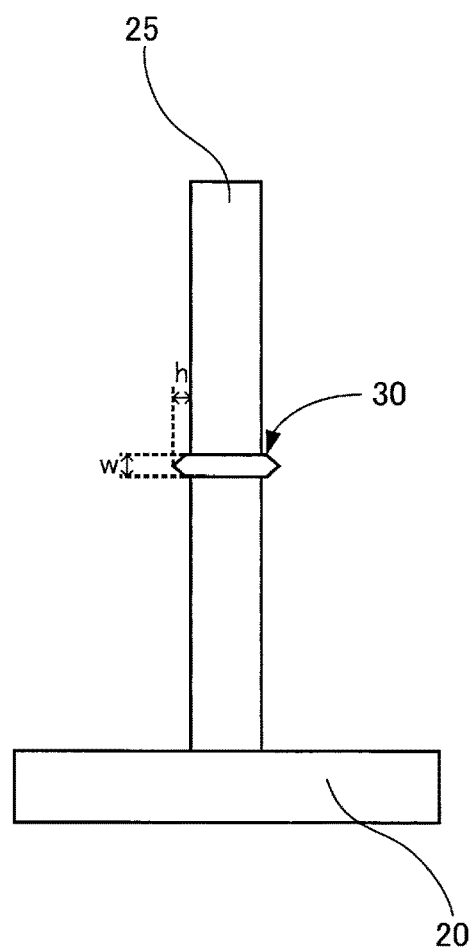
FIG. 8 illustrates a pin-shaped external terminal of the semiconductor module according to the first embodiment.

FIG. 8 illustrates a pin-shaped external terminal 25 of the semiconductor module 10 according to the first embodiment.

Figure 9:
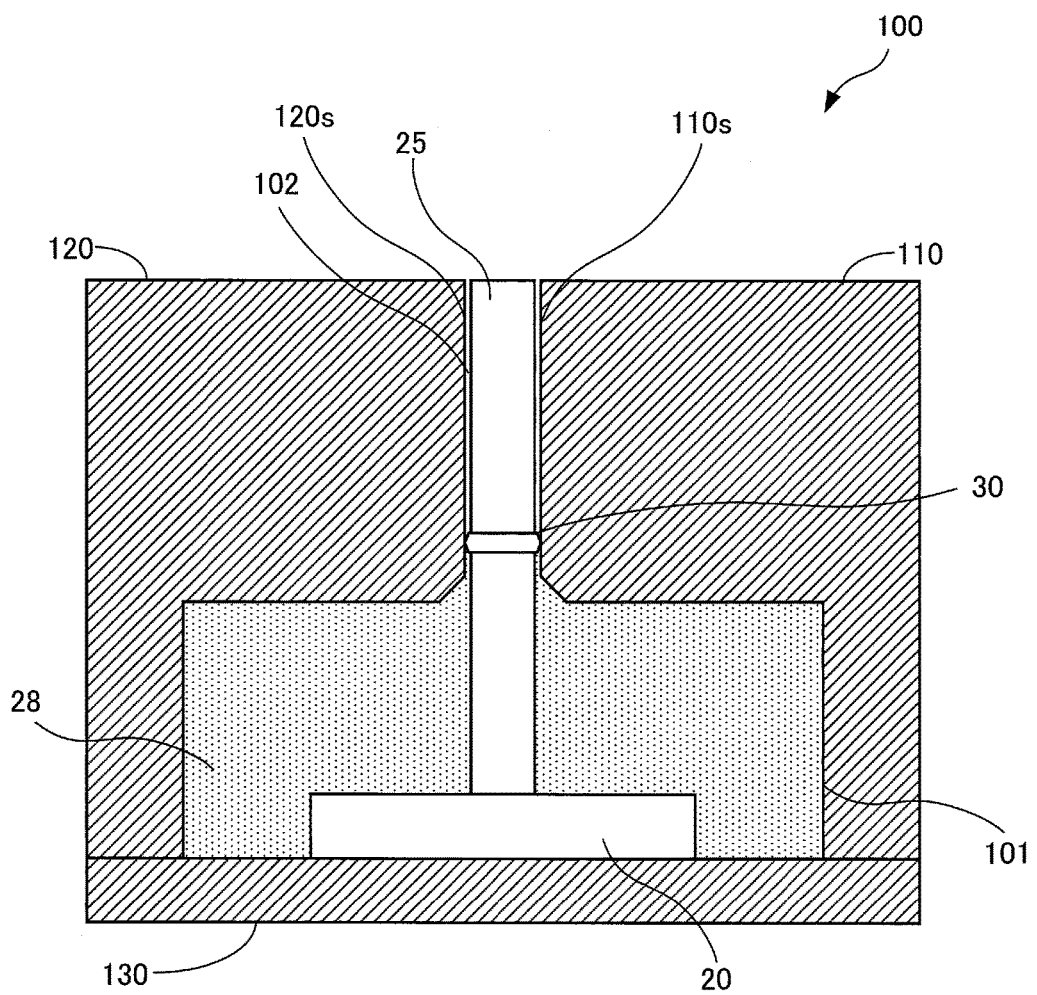
FIG. 9 illustrates a process for encapsulating the semiconductor module according to the first embodiment with resin.

FIG. 9 illustrates a process for encapsulating the semiconductor module 10 according to the first embodiment with resin.

Figure 10:
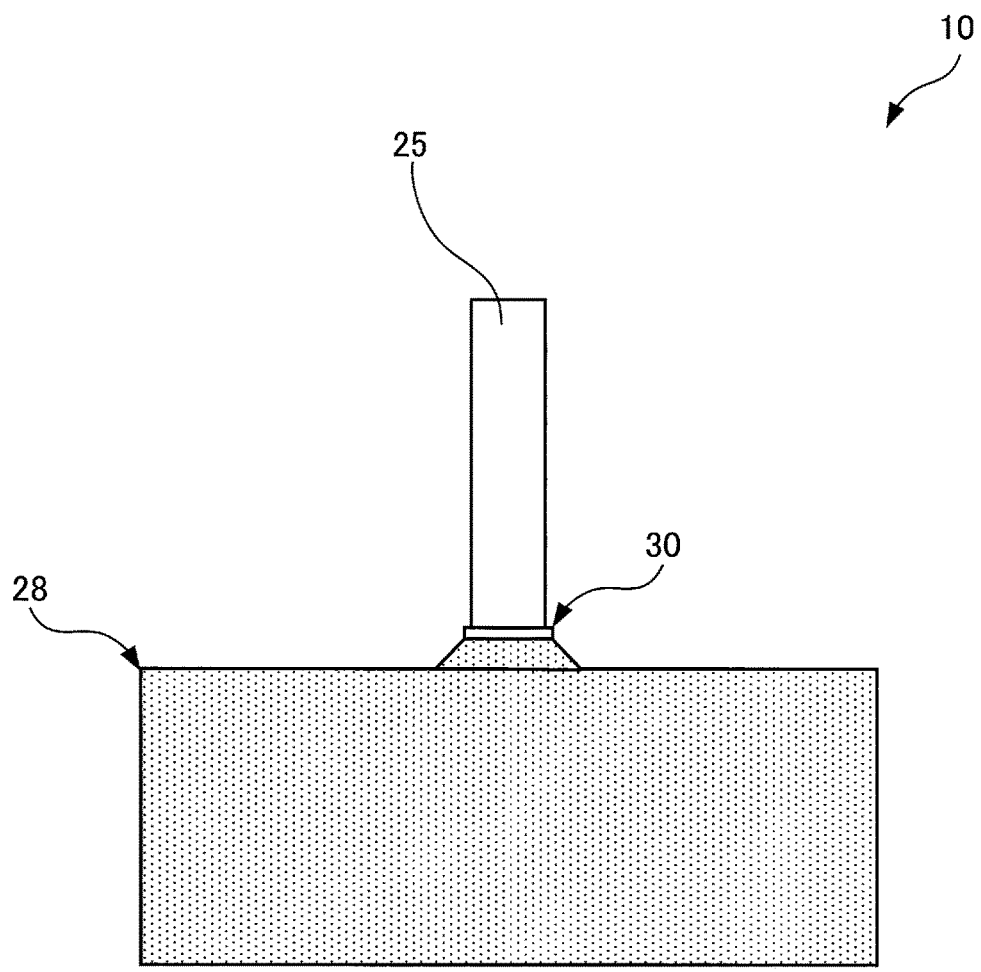
FIG. 10 is a side view of the semiconductor module according to the first embodiment.

FIG. 10 is a side view of the semiconductor module 10 according to the first embodiment.

As illustrated in FIG. 8, an outflow prevention portion 30 is arranged on the outer surface portion of the pin-shaped external terminal 25. For example, the outflow prevention portion 30 is formed on the outer surface portion of the external terminal 25 by injection molding, cutting work, or pressure deformation. In addition, as will be described below, it is preferable that the outflow prevention portion 30 have a shape that is easily deformed when the external terminal 25 is fitted between the movable lower die 120 and the fixed lower die 110. For example, it is desirable that the outflow prevention portion 30 have a protrusion having a pointed end, a narrow width (w), and a high height (h). It is also preferable that the outflow prevention portion 30 be made of the same material as that of the external terminal 25. For example, the outflow prevention portion 30 may be made of copper.

In addition, the outflow prevention portion 30 is arranged immediately above an area expected to be an encapsulation end of the external terminal 25. Namely, when the external terminal 25 is placed in the transfer molding die 100, the outflow prevention portion 30 is arranged on an outer surface portion of the external terminal 25, the outer surface portion being located near the border between the first cavity 101 and the second cavity 102.

The external terminal 25 having the outflow prevention portion 30 is placed in the transfer molding die 100 described with reference to FIG. 6. When the outflow prevention portion 30 of the external terminal 25 is sandwiched between the combined parting surfaces 110s and 120s, the outflow prevention portion 30 is deformed by the shape of the inner wall of the second cavity 102.

After the substrate 20 and the external terminal 25 are placed in the transfer molding die 100 in this way, resin is injected into the first cavity 101.

With a conventional technique, when the first cavity 101 is filled with the injected resin, the resin flows into the space between the second cavity 102 and the external terminal 25. However, according to the present embodiment, as illustrated in FIG. 9, since the space between the second cavity 102 and the external terminal 25 is filled with the outflow prevention portion 30 of the external terminal 25, outflow of the resin is prevented.

After the injected resin is hardened, when the semiconductor module 10 is extracted from the transfer molding die 100, it is seen that no burr has been formed on the external terminal 25 encapsulated by the encapsulation resin 28, as illustrated in FIG. 10.

Having been deformed from its original shape, the outflow prevention portion 30 remains near the encapsulation resin 28 on the external terminal 25 of the semiconductor module 10. This outflow prevention portion 30 may be removed from the external terminal 25.

To manufacture the above semiconductor module 10, first, the pin-shaped external terminal 25 and the transfer molding die including the fixed lower die 110, the movable lower die 120, and the upper die 130 are prepared. The external terminal 25 is attached to and electrically connected to the substrate 20. The outflow prevention portion 30 may previously be formed on the outer surface portion of the external terminal 25 or may be formed after the external terminal 25 is attached to the substrate 20. Next, the fixed lower die 110, the movable lower die 120, and the upper die 130 are combined with each other, to form the first cavity 101 that accommodates the substrate 20 and the second cavity 102 that is in communication with the first cavity 101 and that accommodates the external terminal 25. When assembling the transfer molding die, the corresponding parting surfaces 110s and 120s of the fixed lower die 110 and the movable lower die 120 are firmly attached to each other so that the outflow prevention portion 30 is sandwiched between the fixed lower die 110 and the movable lower die 120. The outflow prevention portion 30 may be deformed when sandwiched between these dies 110 and 120. Next, resin is injected into the first cavity 101 to encapsulate the substrate 20.

In this way, the outflow prevention portion 30 prevents the resin injected into the first cavity 101 from flowing into the space between the second cavity 102 and the external terminal 25. Thus, formation of a burr on the outer surface portion of the external terminal 25 is prevented. Namely, characteristics of the semiconductor module 10 manufactured in this way are not deteriorated. In addition, since manufacturing the semiconductor module does not need any burr removal process, the manufacturing cost of the semiconductor module 10 is decreased.

[Second Embodiment]

Next, a second embodiment will be described with reference to FIG. 11. In the second embodiment, an individual external terminal 25 is provided with an outflow prevention portion different from that according to the first embodiment.

Figure 11:
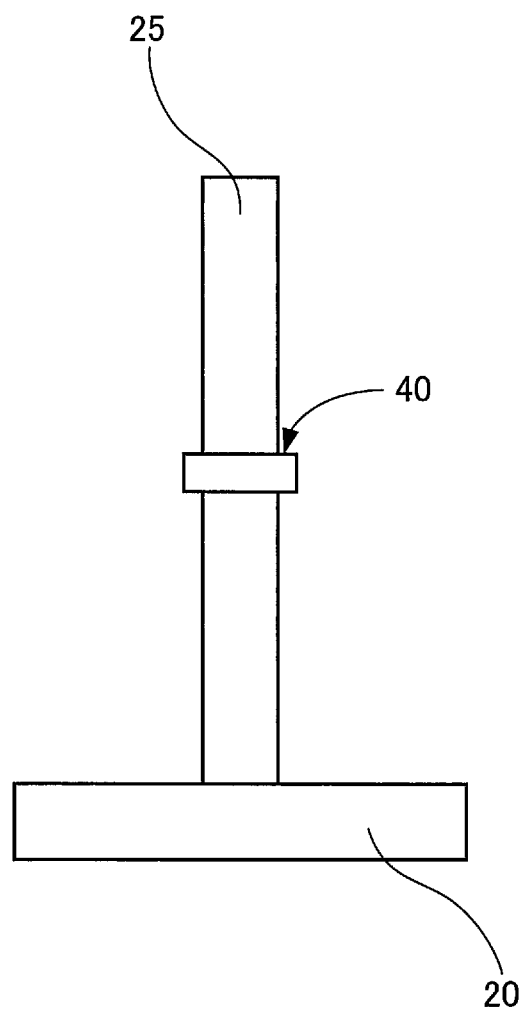
FIG. 11 illustrates a pin-shaped external terminal of a semiconductor module according to a second embodiment.

FIG. 11 illustrates a pin-shaped external terminal of a semiconductor module according to the second embodiment.

In the second embodiment, as illustrated in FIG. 11, the outer surface portion of the external terminal 25 is provided with an outflow prevention portion 40 made of an elastic member having excellent heat resistance such as a silicone rubber.

By forming this outflow prevention portion 40 on the external terminal 25, the same advantageous effects as those in the first embodiment are also obtained. Namely, when the external terminal 25 is placed in the transfer molding die 100, the outflow prevention portion 40 of the external terminal 25 is sandwiched between the fixed lower die 110 and the movable lower die 120 combined with each other and is deformed by the shape of the inner wall of the second cavity 102. Next, resin is injected into the first cavity 101. With a conventional technique, when the first cavity 101 is filled with the injected resin, the resin flows into the space between the second cavity 102 and the external terminal 25. However, according to the present embodiment, since the space between the second cavity 102 and the external terminal 25 is filled with the outflow prevention portion 40 of the external terminal 25, outflow of the resin is prevented.

Thus, formation of a burr on the outer surface portion of the external terminal 25 is prevented. Namely, characteristics of the semiconductor module 10 manufactured in this way are not deteriorated. In addition, since manufacturing the semiconductor module 10 does not need any burr removal process, the manufacturing cost of the semiconductor module 10 is decreased.

[Third Embodiment]

Next, a third embodiment will be described with reference to FIG. 12. In the third embodiment, an individual external terminal 25 is provided with at least one outflow prevention portion different from those according to the first and second embodiments.

Figure 12:
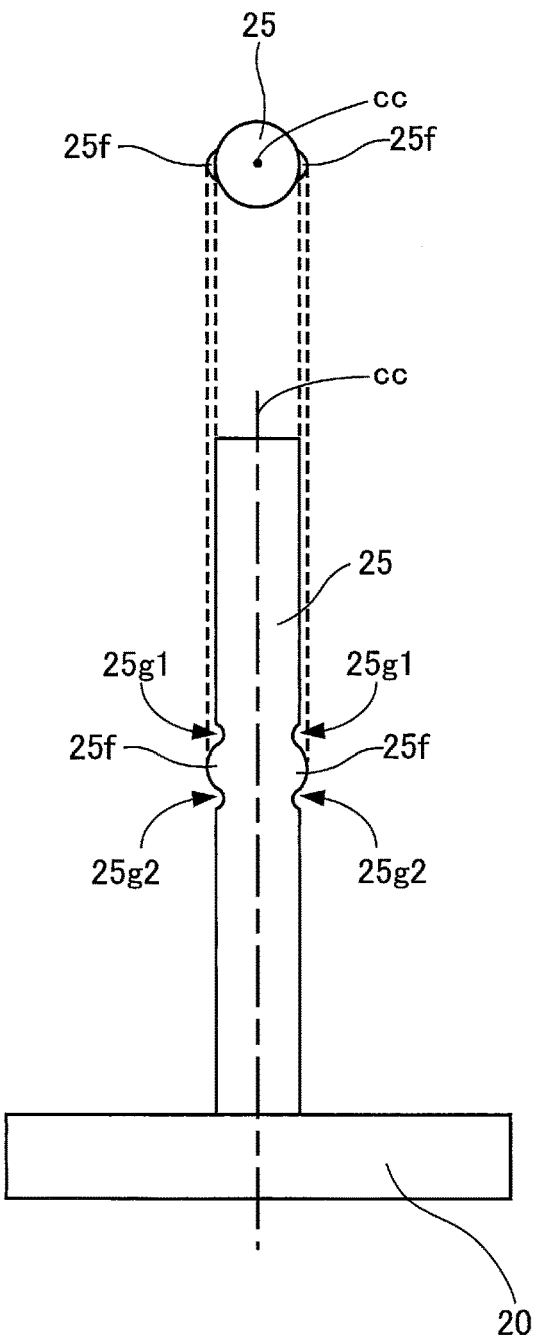
FIG. 12 illustrates a pin-shaped external terminal of a semiconductor module according to a third embodiment.

FIG. 12 illustrates a pin-shaped external terminal 25 of a semiconductor module according to a third embodiment.

The upper part of FIG. 12 illustrates a top view of the external terminal 25, and the lower part of FIG. 12 illustrates a side view of the external terminal 25.

In the third embodiment, as illustrated in FIG. 12, two pairs of depressed portions 25$g$1 and 25$g$2 are formed vertically in a longitudinal direction of the external terminal 25. More specifically, the two pairs are formed on two sides of the outer surface portion of the external terminal 25, respectively. By forming a pair of depressed portions 25$g$1 and 25$g$2, a protruded portion is formed therebetween as an outflow prevention portion 25$f$.

Next, a method of forming the external terminal 25 on which an outflow prevention portion 25$f$ is formed will be described with reference to FIGS. 13A and 13B.

Figure 13B:
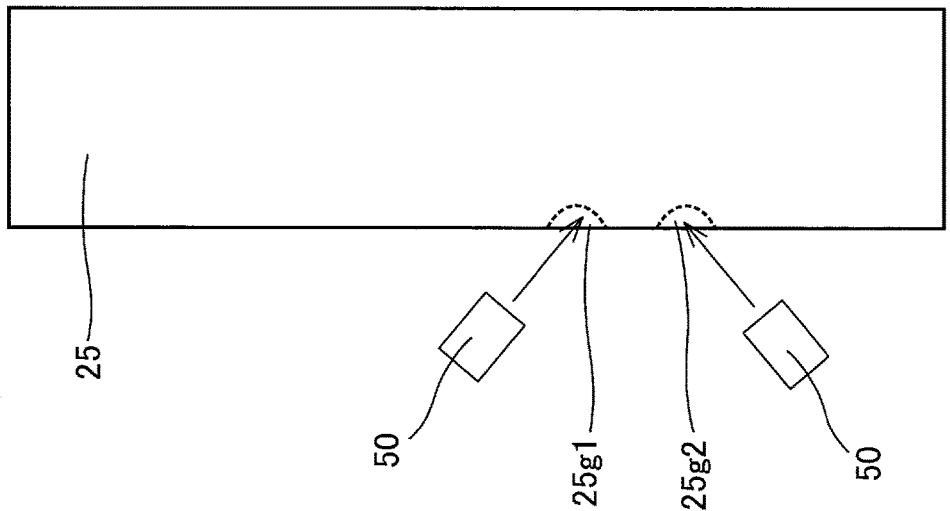
FIGS. 13A and 13B illustrate a method of forming the pin-shaped external terminal of the semiconductor module according to the third embodiment.
Figure 13A:
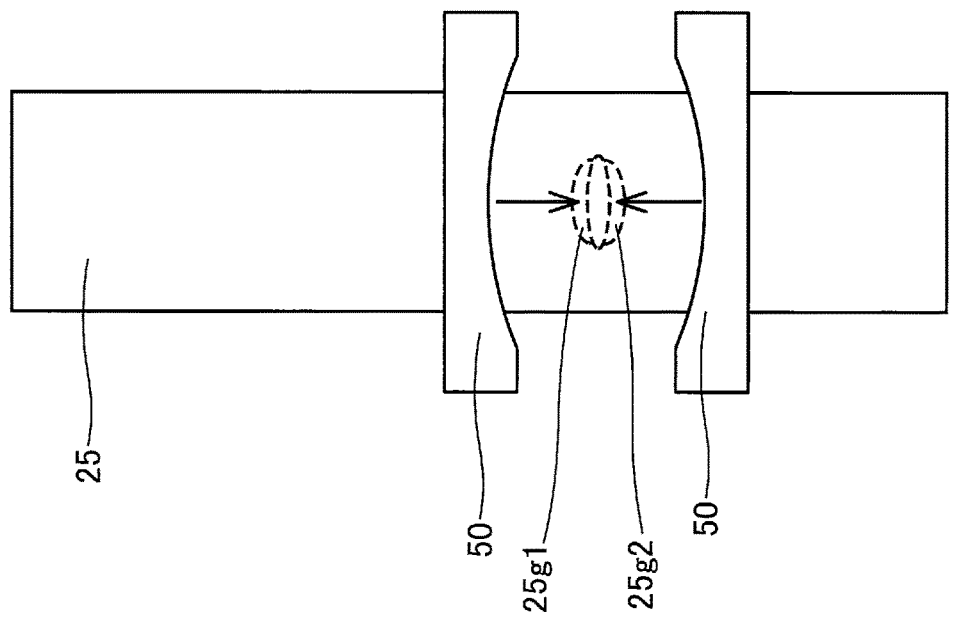

FIGS. 13A and 13B illustrate a method of forming a pin-shaped external terminal 25 of the semiconductor module according to the third embodiment.

FIGS. 13A and 13B are front and side views of an outflow prevention portion 25$f$ of an external terminal 25, respectively.

The upper and lower portions (in the longitudinal direction of the external terminal 25) of an area where an outflow prevention portion 25$f$ of the external terminal 25 is to be formed are pressed by a pressing device 50, to form a pair of depressed portions 25$g$1 and 25$g$2. In this way, by creating a protruded portion between the depressed portions 25$g$1 and 25$g$2, an outflow prevention portion 25$f$ is formed. The outflow prevention portion 25$f$ may previously be formed on the outer surface portion of the external terminal 25 in this way or may be formed after the external terminal 25 is attached to the substrate 20. One or more outflow prevention portions 25$f$ may be formed on the external terminal 25. Two or more outflow prevention portions 25$f$ may be formed symmetrically with respective to a central axis cc of the external terminal 25. Alternatively, two outflow prevention portions 25$f$ may be formed on positions opposite to each other on the outer surface portion of the external terminal 25.

In the third embodiment, an individual outflow prevention portion 25$f$ is formed so that the longitudinal direction thereof is perpendicular to the longitudinal direction of the external terminal 25. Alternatively, an individual outflow prevention portion 25$f$ may be formed so that the longitudinal direction thereof is in parallel to the longitudinal direction of the external terminal 25.

In addition, as in the first embodiment, an individual outflow prevention portion 25$f$ is formed immediately above an area expected to be an encapsulation end of the external terminal 25. Namely, when the external terminal 25 is placed in the transfer molding die 100, an individual outflow prevention portion 25$f$ is arranged on an outer surface portion of the external terminal 25, the outer surface portion being located near the border between the first cavity 101 and the second cavity 102.

Next, assembly of the transfer molding die 100 for manufacturing the semiconductor module 10 including an external terminal 25 on which outflow prevention portions 25$f$ have been formed will be described with reference to FIGS. 14A to 14D.

FIGS. 14A to 14D illustrate attachment of the transfer molding die 100 for manufacturing the semiconductor module 10 according to the third embodiment.

Figure 14A:
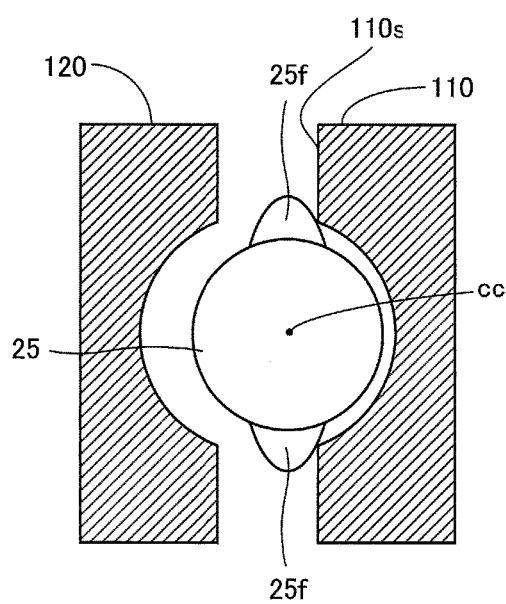
FIGS. 14A to 14D illustrate attachment of a transfer molding die used for manufacturing the semiconductor module according to the third embodiment.
Figure 14B:
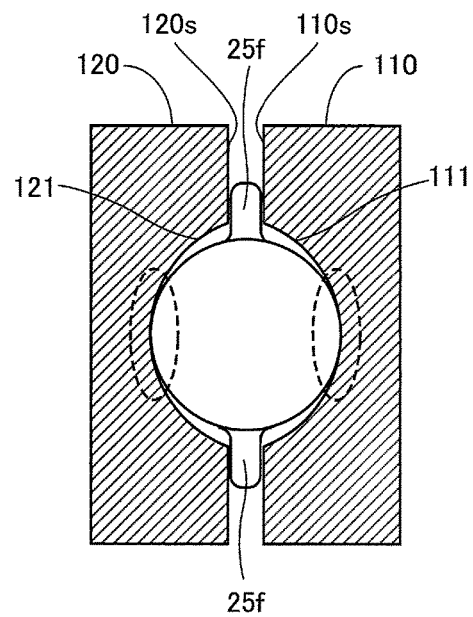

FIGS. 14A and 14B are top views of the transfer molding die 100 and an external terminal 25. In FIG. 14A, the fixed lower die 110 has been attached to the external terminal 25.

In FIG. 14B, the movable lower die 120 has been attached to the external terminal 25 to which the fixed lower die 110 has been attached.

Figure 14C:
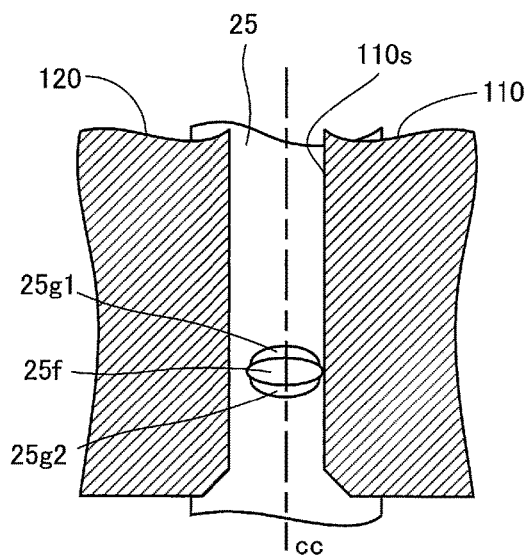
Figure 14D:
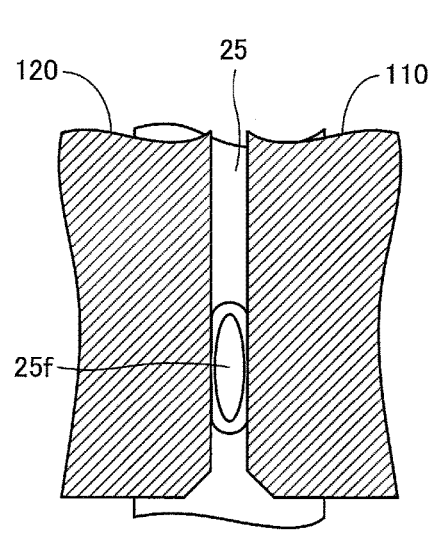

FIGS. 14C and 14D are side views of the transfer molding die 100 and the external terminal 25. In FIG. 14C, the fixed lower die 110 has been attached to the external terminal 25. In FIG. 14D, the movable lower die 120 has been attached to the external terminal 25 to which the fixed lower die 110 has been attached.

First, as illustrated in FIGS. 14A and 14C, the fixed lower die 110 is attached to the external terminal having the outer surface portion on which outflow prevention portions 25f are formed. In this state, the outflow prevention portions 25f are into contact with the corresponding parting surface 110s of the fixed lower die 110. The pair of outflow prevention portions 25f are arranged opposite to each other to sandwich the central axis cc on the outer surface portion of the external terminal 25.

Next, the movable lower die 120 is moved toward the fixed lower die 110 and is attached to the external terminal 25. Consequently, as illustrated in FIG. 14B, the external terminal 25 comes into contact with the inner wall of the recess 111 of the fixed lower die 110 and the inner wall of the recess 121 of the movable lower die 120 (the portions indicated by dashed lines in FIG. 14B). In addition, as illustrated in FIGS. 14B and 14D, the pair of outflow prevention portions 25f are pressed and deformed by the parting surfaces 110s and 120s of the fixed lower die 110 and the movable lower die 120. The deformed outflow prevention portions 25f fill the space between the fixed lower die 110 and the movable lower die 120. As a result, the space between the external terminal 25 and the second cavity 102 formed by the fixed lower die 110 and the movable lower die 120 is adequately filled with the deformed outflow prevention portions 25f.

The parting surfaces 110s and 120s of the fixed lower die 110 and the movable lower die 120 are formed by processing the parting surfaces 110s and 120s of the fixed lower die 110 and the movable lower die 120 according to the first or second embodiment so that the external terminal 25 comes into contact with the inner walls of the recesses 111 and 121 (the portions indicated by dashed lines in FIG. 14B). It is preferable that the cross section of the second cavity 102 be an oval when the cross section of the external terminal 25 is a circle.

After the substrate 20 and the external terminal 25 having the outflow prevention portions 25f are placed in the transfer molding die 100 in this way, resin is injected into the first cavity 101.

With a conventional technique, when the first cavity 101 is filled with the injected resin, the resin flows into the space between the second cavity 102 and the external terminal 25.

However, according to the present embodiment, as illustrated in FIGS. 14B and 14D, the space between the parting surfaces 110s and 120s of the fixed lower die 110 and the movable lower die 120 is filled with the deformed outflow prevention portions 25f. In addition, the external terminal 25 is into contact with the inner walls of the recesses 111 and 121 (the portions indicated by dashed lines in FIG. 14B). Thus, since the space between the second cavity 102 and the external terminal 25 is filled with the outflow prevention portions 25f, the resin does not flow into the space.

After the injected resin is hardened, when the semiconductor module 10 is extracted from the transfer molding die 100, it is seen that no burr has been formed on the external terminal 25 encapsulated by the encapsulation resin 28.

Next, a specific size of an outflow prevention portion 25f will be described with reference to FIG. 15.

First, an outflow prevention portion 25f whose cross section is a semicircle will be described.

Figure 15:
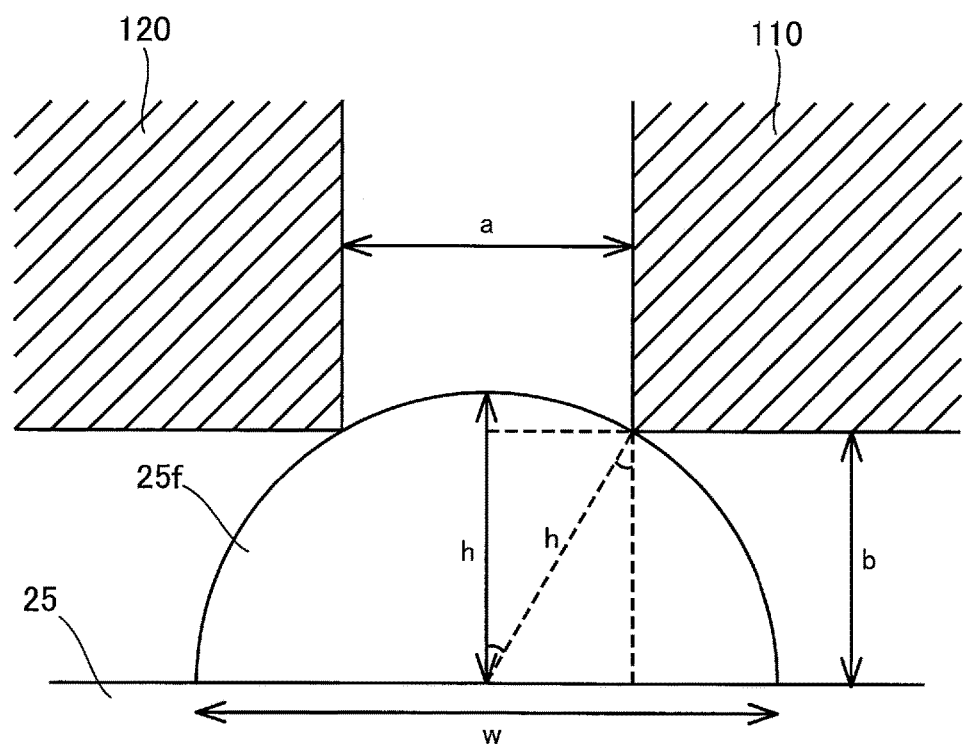
FIG. 15 illustrates an outflow prevention portion formed on the pin-shaped external terminal of the semiconductor module according to the third embodiment.

FIG. 15 illustrates an outflow prevention portion 25f formed on a pin-shaped external terminal 25 of a semiconductor module 10 according to the third embodiment.

FIG. 15 is an enlarged top view of an external terminal 25 when an outflow prevention portion 25f of the external terminal 25 is into contact with the fixed lower die 110 and the movable lower die 120.

The following description assumes that the distance between the fixed lower die 110 and the movable lower die 120 is a and that the distance between the fixed lower die 110 (or the movable lower die 120) and the external terminal 25 is b, as illustrated in FIG. 15. In addition, the following description assumes that the radius and diameter of the outflow prevention portion 25f are h and w (=2h), respectively, (h≥b, w≥a).

In this case, since $h^2$ can be represented as $(a/2)^2+b^2$, the following equations can be established:

$$h=\sqrt{((a/2)^2+b^2)}$$

$$w=2h$$

For example, when a=b=10 μm, h is 11.2 μm, and w is 22.4 μm.

By forming an outflow prevention portion 25f with this size on an external terminal 25, a semiconductor module 10 having an external terminal 25 without a burr is obtained.

Next, an outflow prevention portion 25f whose cross section is a triangle will be described with reference to FIG. 16.

Figure 16:
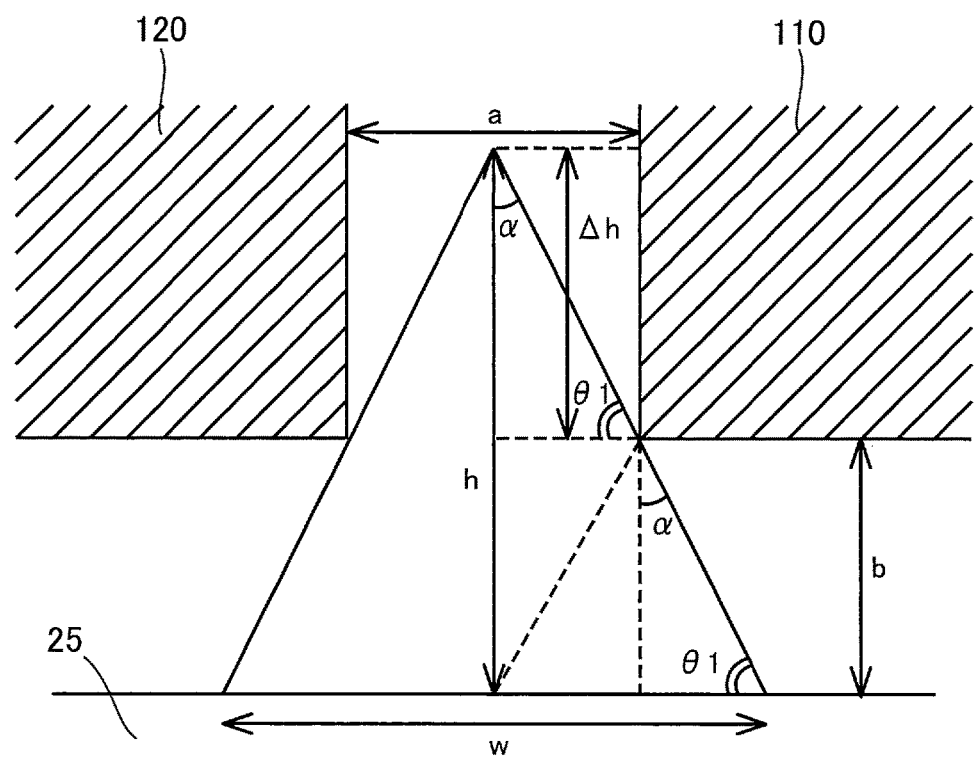
FIG. 16 illustrates another outflow prevention portion formed on the pin-shaped external terminal of the semiconductor module according to the third embodiment.

FIG. 16 illustrates another outflow prevention portion 25f formed on a pin-shaped external terminal 25 of a semiconductor module 10 according to the third embodiment.

FIG. 16 is also an enlarged top view of an external terminal 25 when an outflow prevention portion 25f of the external terminal 25 is into contact with the fixed lower die 110 and the movable lower die 120.

The following description assumes that the distance between the fixed lower die 110 and the movable lower die 120 is a and that the distance between the fixed lower die 110 (or the movable lower die 120) and the external terminal 25 is b, as illustrated in FIG. 16. In addition, the following description assumes that the height of the outflow prevention portion 25f, the length of the base, and the height from the apex to the lower surface of the fixed lower die 110 (or the movable lower die 120) are h, w, and Δh (=h−b), respectively. In addition, the following description assumes the base angle is θ1 and half of the vertex angle is α.

In this case, since tan θ1=Δh/(a/2), Δh=tan θ1*(a/2). In addition, since tan θ1=h/(w/2), (w/2)=h/tan θ1. Thus, the following equations can be established:

$$h=b+\tan \theta 1*(a/2)$$

$$w=2h/\tan \theta 1$$

For example, when α is 5° (namely, θ1 is 85°) and a=b=10 μm, h is 67.2 μm and w is 11.8 μm.

In addition, when α is 85° (namely, θ1 is 5°) and a=b=10 μm, h is 10.4 μm and w is 237.7 μm.

In addition, when α is 30° (namely, θ1 is 60°) and a=b=10 μm, h is 18.7 μm and w is 21.6 μm.

By forming an outflow prevention portion 25f with this size on an external terminal 25, a semiconductor module 10 having an external terminal 25 without a burr is obtained.

To manufacture the above semiconductor module 10, first, at least one outflow prevention portion 25f is formed on the outer surface portion of a pin-shaped external terminal 25 attached to and electrically connected to a substrate 20. Next, the transfer molding die 100 including the fixed lower die 110 and the movable lower die 120 is prepared, and these lower dies are combined with each other to form the first cavity 101 that accommodates the substrate 20 and the second cavity 102 that is in communication with the first cavity 101 and that accommodates the external terminal 25. The fixed lower die 110 and the movable lower die 120 are combined with each other to sandwich the outflow prevention portion 25f. When the fixed lower die 110 and the movable lower die 120 are combined and the outflow prevention portion 25f is sandwich therebetween, the outflow prevention portion 25f is deformed. Consequently, the interface between the fixed lower die 110 and the movable lower die 120 is filled with the outflow prevention portion 25f. In addition, when the fixed lower die 110 and the movable lower die 120 are combined and the outflow prevention portion 25f is sandwich therebetween, the external terminal 25 comes into contact with the inner wall of the second cavity 102. Next, the substrate 20 is encapsulated by injecting encapsulation resin into the first cavity 101.

In this way, the outflow prevention portion 25f prevents the resin injected into the first cavity 101 from flowing into the space between the second cavity 102 and the external terminal 25. Thus, formation of a burr on the outer surface portion of the external terminal 25 is prevented. Namely, characteristics of the semiconductor module 10 manufactured in this way are not deteriorated. In addition, since manufacturing the semiconductor module does not need any burr removal process, the manufacturing cost of the semiconductor module 10 is decreased.

[Fourth Embodiment]

Figure 17A:
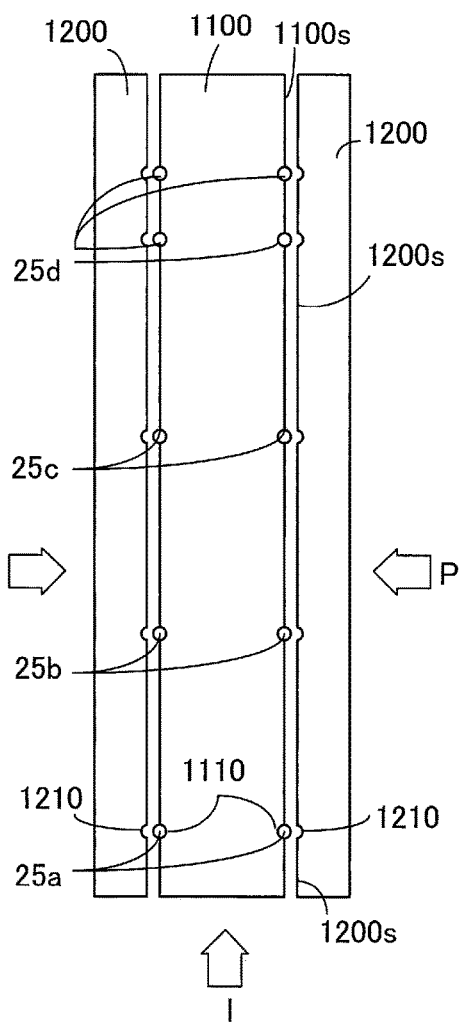
FIGS. 17A and 17B illustrate a semiconductor module according to a fourth embodiment and a transfer molding die used for the semiconductor module.
Figure 17B:
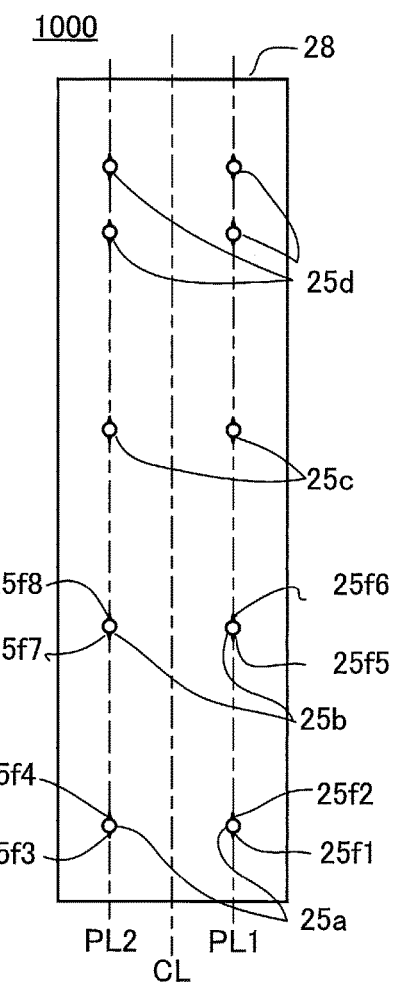

FIG. 17A illustrates a transfer molding die used for manufacturing a semiconductor module 1000 to a fourth embodiment, and FIG. 17B is a top view of the semiconductor module 1000.

Figure 18:
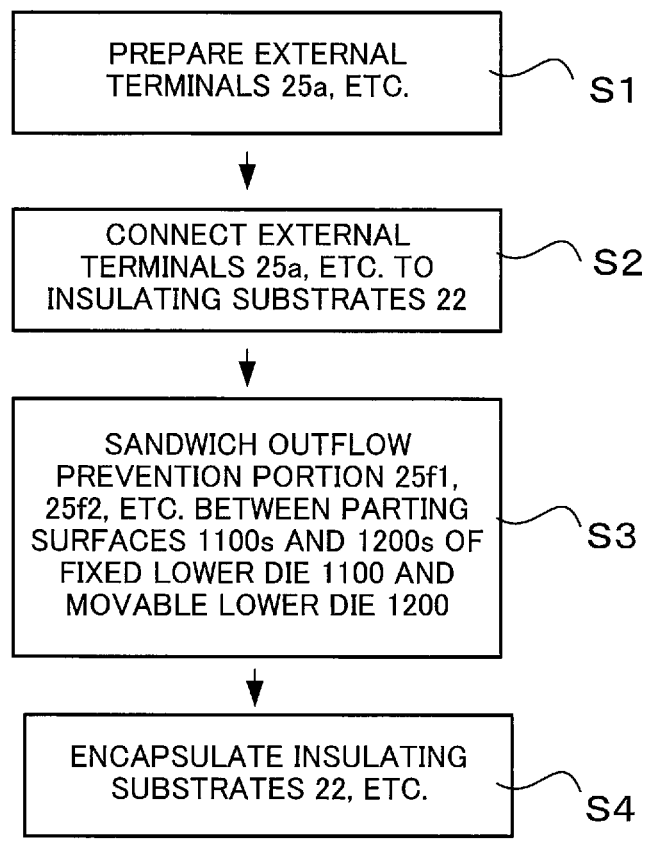
FIG. 18 is a flowchart illustrating a process for manufacturing the semiconductor module according to the fourth embodiment.
Figure 19A:
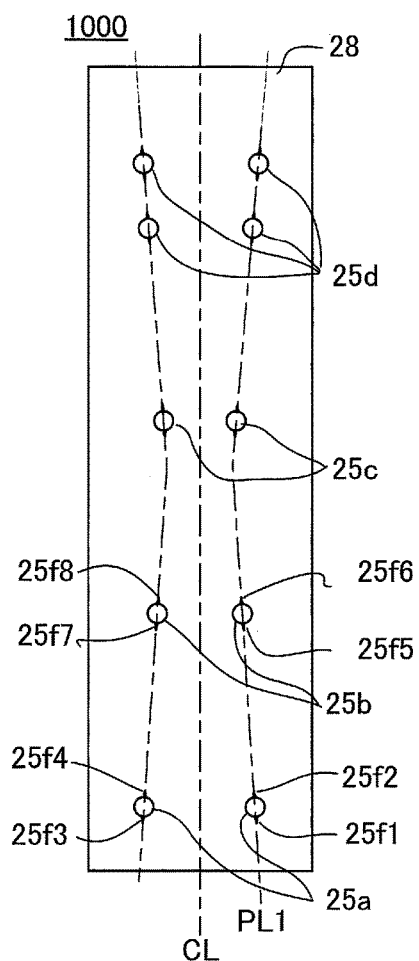
FIGS. 19A and 19B are top views of variations of the semiconductor module according to the fourth embodiment.
Figure 19B:
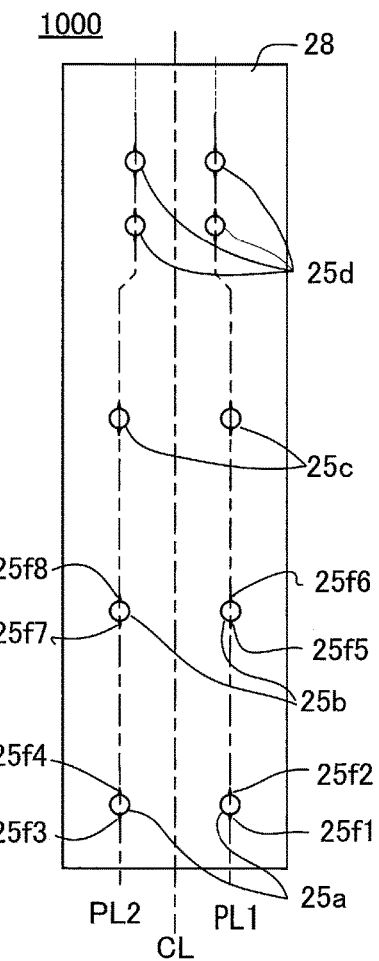

FIG. 18 is a flowchart illustrating a process for manufacturing the semiconductor module 1000 according to the fourth embodiment. FIGS. 19A and 19B are top views of variations of the semiconductor module 1000 according to the fourth embodiment.

The semiconductor module 1000 according to the fourth embodiment has the same structure as that of the semiconductor module 10 according to the first embodiment, except the arrangement of the external terminals 25d.

The semiconductor module 1000 includes an insulating substrate 22, a semiconductor chip 21b mounted above the insulating substrate 22, encapsulation resin 28 encapsulating the insulating substrate 22 and the semiconductor chip 21b, a pair of external terminals 25a, and a pair of external terminals 25b. The semiconductor chip 21b includes a collector electrode and an emitter electrode opposite thereto. The encapsulation resin 28 has at least a top surface. The top surface may have a pair of long sides opposite to each other and a pair of short sides opposite to each other. The encapsulation resin 28 may substantially be a cuboid. The pair of external terminals 25a are electrically connected to the collector electrode of the semiconductor chip 21b via a copper plate 27a above the insulating substrate 22, for example. The pair of external terminals 25b are electrically connected to the emitter electrode of the semiconductor chip 21b via a wiring substrate 23, for example.

One of the external terminals 25a has outflow prevention portions 25f1 and 25f2, and the other external terminal 25a has outflow prevention portions 25f3 and 25f4. One of the external terminals 25b has outflow prevention portions 25f5 and 25f6, and the other external terminal 25b has outflow prevention portions 25f7 and 25f8. One of the external terminals 25a and one of the external terminals 25b are arranged in a longitudinal direction of the top surface of the encapsulation resin 28. The other external terminal 25a and the other external terminal 25b are also arranged in the longitudinal direction of the top surface. In addition, the outflow prevention portion 25f1, etc. and the outflow prevention portion 25f5, etc. are arranged on the top surface. The outflow prevention portion 25f1, etc. and the outflow prevention portion 25f5, etc. may be arranged near the top surface. In addition, the longitudinal direction may be a direction in which the longs sides of the top surface extend.

The outflow prevention portions 25f1 and 25f2 of the external terminal 25a may be arranged in the longitudinal direction of the top surface of the encapsulation resin 28. The outflow prevention portions 25f3 and 25f4 of the external terminal 25a and the outflow prevention portions 25f5 to 25f8 of the external terminals 25b may also be arranged in the longitudinal direction of the top surface.

The outflow prevention portions 25f1 and 25f2 may be arranged symmetrically with respect to the central axis of the external terminal 25a. The outflow prevention portions 25f3 and 25f4 may also be arranged symmetrically with respect to the central axis of the other external terminal 25a. Likewise, the outflow prevention portions 25f5 and 25f6 and the outflow prevention portions 25f7 and 25f8 may also be arranged symmetrically with respect to the central axes of the respective external terminals 25b. The central axis of an external terminal is a line that extends through the external terminal in a longitudinal direction thereof. For example, if the cross section of an external terminal is a circle, the central axis thereof extends through the center of the circle.

In the example in FIG. 17B, the pair of external terminals 25a, the pair of external terminals 25b, and a pair of external terminals 25c are arranged in two lines in the semiconductor module 1000. One of the external terminals 25a, one of the external terminals 25b, and one of the external terminals 25c are arranged on a line PL1 parallel to a center line CL, and the other external terminal 25a, the other external terminal 25b, and the other external terminal 25c are arranged on a line PL2 on the other side of the center line CL. A pair of external terminals 25d may be arranged on the line PL1, and another pair of external terminals 25d may be arranged on the line PL2, as illustrated in FIG. 17B. The outflow prevention portions 25f1 and 25f2 of one of the external terminals 25a and the outflow prevention portions 25f5 and 25f6 of one of the external terminals 25b are arranged in parallel to the line PL1. The outflow prevention portions 25f3 and 25f4 of the other external terminal 25a and the outflow prevention portions 25f7 and 25f8 of the other external terminal 25b are arranged in parallel to the line PL2. The center line CL is a line that extends through substantially the center on the top surface in the longitudinal direction thereof. It is preferable that the center line CL be a line that substantially divides the area of the top surface in two. The lines PL1 and PL2 may be in parallel to each other.

The shape of the top surface may substantially be a rectangle having a pair of long sides opposite to each other and a pair of short sides opposite to each other. A pair of external terminals 25a and 25b may be arranged along one of the long sides, and the other pair of external terminals 25a and 25b may be arranged along the other long side. The pair of external terminals 25a and the pair of external terminals 25*b* may be sequentially arranged from one of the short sides of the top surface in the longitudinal direction thereof.

The semiconductor module 1000 may additionally include a semiconductor chip 21*a* mounted above an insulating substrate 22. For example, the semiconductor chip 21*a* has a collector electrode electrically connected to the pair of external terminals 25*c* via a copper plate 27*a* above the insulating substrate 22. For example, the semiconductor chip 21*a* has an emitter electrode electrically connected to the pair of external terminals 25*a* via the wiring substrate 23. For example, the external terminals 25*d* may be connected to gate and sense electrodes of the semiconductor chips 21*a* and 21*b* via the wiring substrate 23.

A manufacturing method of the semiconductor module 1000 will be described with reference to FIGS. 17A and 18. First, the pin-shaped external terminals 25*a* to 25*d* and a transfer molding die including a fixed lower die 1100, a pair of movable lower dies 1200, and an upper die (not illustrated) are prepared (S1). The external terminals 25*a*, etc. are attached to the copper plates 27*a* above the respective insulating substrates 22 and electrically connected to the respective insulating substrates 22 (S2). One of the external terminals 25*a* has an outer surface portion on which the pair of outflow prevention portions 25/1 and 25/2 are formed. The other external terminal 25*a* has an outer surface portion on which the pair of outflow prevention portions 25/3 and 25/4 are formed. The other external terminals 25*b* to 25*d* have the like structure. It is preferable that these outflow prevention portions 25/1, 25/2, etc. be formed in accordance with the method described in the third embodiment. These outflow prevention portions 25/1, 25/2, etc. may previously be formed or may be formed after the external terminals 25*a*, etc. are attached to the respective insulating substrates 22. Next, the fixed lower die 1100, the movable lower dies 1200, and the upper die are combined to each other, to form a first cavity that accommodates the insulating substrate 22, the semiconductor chips 21*a* and 21*b*, and the wiring substrate 23 and a second cavity that is in communication with the first cavity and that accommodates the external terminals 25*a*, etc. When the dies are combined with each other, corresponding parting surfaces 1100*s* and 1200*s* of the fixed lower die 1100 and the movable lower die 1200 are firmly attached to each other. More specifically, by pressing the dies in the direction of P in FIG. 17A, the outflow prevention portions 25/1, 25/2, etc. are sandwiched between the corresponding parting surfaces 1100*s* and 1200*s* (S3). It is preferable that the external terminals 25*a*, etc. be attached to the insulating substrates 22 so that the outflow prevention portions 25/1, 25/2, etc. are aligned on the corresponding parting surface 1100*s*. The outflow prevention portions 25*f* may be deformed when sandwiched between the dies. Next, the encapsulation resin 28 is injected into the first cavity in the direction of I in FIG. 17A and is then hardened, to encapsulate the insulating substrates 22, etc. with the encapsulation resin 28 (S4).

In the semiconductor module 1000 manufactured in the above way, the outflow prevention portions 25/1, 25/2, etc. of the external terminals 25*a* are arranged along the center line CL. The outflow prevention portions 25/1 and 25/2 of one of the external terminals 25*a* and the outflow prevention portions 25/5 and 25/6 of one of the external terminals 25*b* are aligned on the parting line PL1 that extends in the longitudinal direction of the top surface of the semiconductor module 1000. In addition, the outflow prevention portions 25/3 and 25/4 of the other external terminal 25*a* and the outflow prevention portions 25/7 and 25/8 of the other external terminal 25*b* are aligned on the parting line PL2 that extends in the longitudinal direction. The outflow prevention portions 25*f* of the external terminals 25*c* and 25*d* may also be aligned on the corresponding parting lines PL1 and PL2.

FIGS. 19A and 19B are top views of variations of the semiconductor module 1000. In the example in FIG. 19A, the center portion of each of the parting lines PL1 and PL2 is bent in the direction of the center line CL. In this case, the outflow prevention portions 25/1 to 25/4 of the external terminals 25*a* and the outflow prevention portions 25/5 to 25/8 of the external terminals 25*b* are arranged on the parting lines PL1 and PL2. The outflow prevention portions 25/1, 25/2, etc. are arranged so that a small angle is formed with respect to the center line CL. The center portion of each of the parting lines PL1 and PL2 may be bent in the opposite direction of the center line CL. When the parting lines PL1 and PL2 are curved lines, the outflow prevention portions 25/1, 25/2, etc. may be arranged to be in parallel to tangent lines of the parting lines PL1 and PL2.

In the example in FIG. 19B, the parting lines PL1 and PL2 are bent near the external terminals 25*d* in the direction of the center line CL. The distance between the center line CL and the parting line PL1 or PL2 on which external terminals 25*d* are arranged is smaller than the distance between the center line CL and the parting line PL1 or PL2 on which the external terminals 25*a* to 25*c* are arranged. The outflow prevention portions 25/1, 25/2, etc. are arranged on the parting lines PL1 and PL2.

By arranging the outflow prevention portions 25/1 to 25/8 in this way in the semiconductor module 1000 including the external terminals 25*a*, etc. arranged in two lines in the longitudinal direction of the encapsulation resin 28, formation of a burr on the external terminals 25*a*, etc. is prevented.

By arranging the outflow prevention portions 25/1 and 25/2 of the external terminal 25*a* and the outflow prevention portions 25/5 and 25/6 of the external terminal 25*b* and the outflow prevention portions 25/3 and 25/4 of the external terminal 25*a* and the outflow prevention portions 25/7 and 25/8 of the external terminal 25*b* in the longitudinal direction of the top surface of the semiconductor module 1000, formation of a burr on the external terminals 25*a* and 25*b* is prevented.

According to the embodiments discussed herein, deterioration of the characteristics of a semiconductor module is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
   an insulating substrate;
   a semiconductor chip that includes a first electrode and a second electrode opposite to each other, and that is mounted above the insulating substrate;
   encapsulation resin that encapsulates the insulating substrate and the semiconductor chip, a top surface of the encapsulation resin having a long side;
   a first external terminal and a second external terminal that are electrically connected to the first electrode; and a third external terminal and a fourth external terminal that are electrically connected to the second electrode;

wherein each of the first to fourth external terminals has an outflow prevention portion formed thereon, wherein the first and third external terminals are arranged along a first line in parallel to the long side of the top surface, and the second and forth external terminals are arranged along a second line in parallel to the long side of the top surface, wherein the outflow prevention portions are arranged along a third line in parallel to the long side of the top surface, and wherein each of the outflow prevention portions has a first prevention portion and a second prevention portion, and the first and second prevention portions are arranged respectively in parallel to the long side of the top surface.

2. The semiconductor module according to claim 1, wherein the first and second prevention portions of each outflow prevention portion are arranged symmetrically with respect to a central axis of the first to fourth external terminals.

3. The semiconductor module according to claim 1, wherein the long side of the top surface includes a first long side and a second long side that are opposite to each other and are in parallel, and wherein the first and third external terminals are arranged by the first long side, and the second and fourth external terminals are arranged by the second long side.

4. The semiconductor module according to claim 1, wherein the first and second external terminals form a first external terminal pair, the third and fourth external terminals form a second external terminal pair, and the first and second external terminal pairs are arranged sequentially in parallel to the long side of the top surface.

5. The semiconductor module according to claim 1, wherein each of the outflow prevention portions is a heat-resistant elastic member.

6. The semiconductor module according to claim 1, wherein each of the outflow prevention portions is of a dome shape.

7. The semiconductor module according to claim 1, wherein each of the outflow prevention portions includes two depressed portions formed on a side surface of the external terminal corresponding to said each outflow prevention portion, and a protruded portion formed between the two depressed portions.

8. A semiconductor module comprising:

an insulating substrate;

a semiconductor chip that includes a first electrode and a second electrode opposite to each other, and that is mounted above the insulating substrate;

encapsulation resin that encapsulates the insulating substrate and the semiconductor chip, a top surface of the encapsulation resin having a long side;

a first external terminal and a second external terminal that are electrically connected to the first electrode; and a third external terminal and a fourth external terminal that are electrically connected to the second electrode;

wherein each of the first to fourth external terminals has an outflow prevention portion formed thereon, the outflow prevention portion being deformable, so that the deformed outflow prevention portion prevents outflow of the encapsulation resin during manufacturing, wherein the first and third external terminals are arranged along a first line in parallel to the long side of the top surface, and the second and forth external terminals are arranged along a second line in parallel to the long side of the top surface, and wherein the outflow prevention portions are arranged on the top surface.

9. The semiconductor module according to claim 8, wherein each of the outflow prevention portions has a first prevention portion and a second prevention portion, and the first and second prevention portions are arranged respectively in parallel to the long side of the top surface.

10. The semiconductor module according to claim 9, wherein the first and second prevention portions of each outflow prevention portion are arranged symmetrically with respect to a central axis of the first to fourth external terminals.

11. The semiconductor module according to claim 9, wherein the long side of the top surface includes a first long side and a second long side that are opposite to each other and are in parallel, and wherein the first and third external terminals are arranged by the first long side, and the second and fourth external terminals are arranged by the second long side.

12. The semiconductor module according to claim 9, wherein the first and second external terminals form a first external terminal pair, the third and fourth external terminals form a second external terminal pair, and the first and second external terminal pairs are arranged sequentially in parallel to the long side of the top surface.

13. The semiconductor module according to claim 8, wherein each of the outflow prevention portions is a heat-resistant elastic member.

14. The semiconductor module according to claim 8, wherein each of the outflow prevention portions is of a dome shape.

15. The semiconductor module according to claim 8, wherein each of the outflow prevention portions includes two depressed portions formed on a side surface of the external terminal corresponding to said each outflow prevention portion, and a protruded portion formed between the two depressed portions.

* * * * *